United States Patent [19]
Daughton et al.

[11] Patent Number: 6,021,065
[45] Date of Patent: *Feb. 1, 2000

[54] SPIN DEPENDENT TUNNELING MEMORY

[75] Inventors: James M. Daughton, Edina; Brenda A. Everitt, Minneapolis, both of Minn.; Arthur V. Pohm, Ames, Iowa

[73] Assignee: Nonvolatile Electronics Incorporated

[*] Notice: This patent issued on a continued prosecution application filed under 37 CFR 1.53(d), and is subject to the twenty year patent term provisions of 35 U.S.C. 154(a)(2).

[21] Appl. No.: 08/965,333

[22] Filed: Nov. 6, 1997

Related U.S. Application Data

[63] Continuation-in-part of application No. 08/704,315, Sep. 6, 1996.
[60] Provisional application No. 60/030,236, Nov. 8, 1996.
[51] Int. Cl.$^7$ ................................................. G11C 7/00
[52] U.S. Cl. ..................... 365/158; 365/145; 365/154; 365/157
[58] Field of Search ................................. 365/157, 158, 365/145, 154, 185.07

[56] References Cited

U.S. PATENT DOCUMENTS

| | | | |
|---|---|---|---|
| 5,251,088 | 10/1993 | Coutellier et al. | 360/113 |
| 5,251,170 | 10/1993 | Daughton et al. | 365/158 |
| 5,361,224 | 11/1994 | Takasu | 365/145 |
| 5,390,061 | 2/1995 | Nakatani et al. | 360/113 |
| 5,452,163 | 9/1995 | Coffey et al. | 360/113 |
| 5,561,368 | 10/1996 | Dovek et al. | 324/252 |
| 5,576,915 | 11/1996 | Akiiyama et al. | 360/113 |
| 5,629,922 | 5/1997 | Moodera et al. | 369/126 |
| 5,636,159 | 6/1997 | Pohm | 365/158 |
| 5,640,343 | 6/1997 | Gallagher et al. | 365/171 |
| 5,648,930 | 7/1997 | Randazzo | 365/185.07 |
| 5,650,958 | 7/1997 | Gallagher et al. | 365/173 |
| 5,751,627 | 5/1998 | Oeishi | 365/145 |

OTHER PUBLICATIONS

"Spin Dependent Tunneling Devices Fabricated Using Photolithography" by Beech et al., *IEEE Transactions on Magnetics*, vol. 32, No. 5, pp. 4713–4715, Sep. 1996.

"Conductance and Exchange Coupling of Two Ferromagnets Separated by a Tunneling Barrier" by Slonczewski, *1989 The American Physical Society*, pp. 6995–7002, Apr. 1989.

"Electron Tunneling Between Ferromagnetic Films", by Maekawa et al., *IEEE Transactions on Magnetics*, vol. Mag–18, No. 2, Mar. 1982.

Electric Tunnel Effect Between Dissimilar Electrodes Separated by a Thin Insulating Film, by Simmons, *Theory of Space–Charge–Limited Emission in Gas Diodes*, pp. 2581–2590.

"Electrical Conduction in Ferromagnetic Metal Oxide Junctions", by Smeltzer, *Journal of Applied Physics*, vol. 42, No. 2, Feb. 1971."Electron Tunneling into Ferromagnetic Metals" by Matsumoto et al., *Journal of Magnetism and Magnetic Materials 20*, 1980 pp. 11–28.

"Spin–Dependent Tunneling into Ferromagnetic Nickel", by Tedrow et al., *Physical Reveiw Letters*, vol. 26, No. 4, Jan. 25, 1971.

(List continued on next page.)

*Primary Examiner*—Vu A. Le
*Attorney, Agent, or Firm*—Kinney & Lange, P.A.

[57] ABSTRACT

A digital data memory having a bit structure in a memory cell based on a dielectric intermediate separating material with two major surfaces having thereon an anisotropic ferromagnetic thin-film of differing thicknesses. These bit structures are fabricated within structural extent limits to operate satisfactorily, and are fabricated as series connected members of storage line structures. A corresponding conductive word line structure adjacent corresponding ones of these memory cells is used for selecting or operating them, or both, in data storage and retrieval operations.

14 Claims, 17 Drawing Sheets

OTHER PUBLICATIONS

"Tunneling Between Ferromagnetic Films" by Julliere, *Physics Letters,* vol. 54A, No. 3, Sep. 1975.

"Spin Polarization of Electrons Tunneling from Films of Fe, Co, Ni, and Gd", by Tedrow et al., *Physical Reveiw B*, vol. 7, No. 1, Jan. 1, 1973.

"Large Magnetoresistance Effect in 82NI–FE, Al–$Al_2O_3$/Co Magnetic Tunneling Junction" by Miyazaki et al., *Journal of Magnetism and Magnetic Materials* , 98 (1999).

Dependence of Magnetoresitance on Temperature and Applied Voltage in a 82Ni–Fe/Al–$Al_2O_3$/Co Tunneling Junction: by Yaoi et al., *Journal of Magnetism and Magnetic Materials* 126, (1993) 430–432.

Ferromagnetic–Insulator–Ferrmagnetic Tunneling: Spin–Dependent Tunneling and Large Magnetoresistance in Trilayer Junctions (Invited), *J. Appl. Phys.* 79 (8), Apr. 15, 1996.

"Geometrically Enhanced Magnetoresistance in Ferromagnet–Insulator–Ferromagnet Tunnel Junctions" by Moodera et al., 1996 American Institute of Physics.

"Optimim, Tunnel Barrier in Ferromagnetic–Insulatoor–Ferromagnetic Tunneling Structures", by Moodera et al., *Appl. Phys Lett.* 70 (922) Jun. 2, 1997.

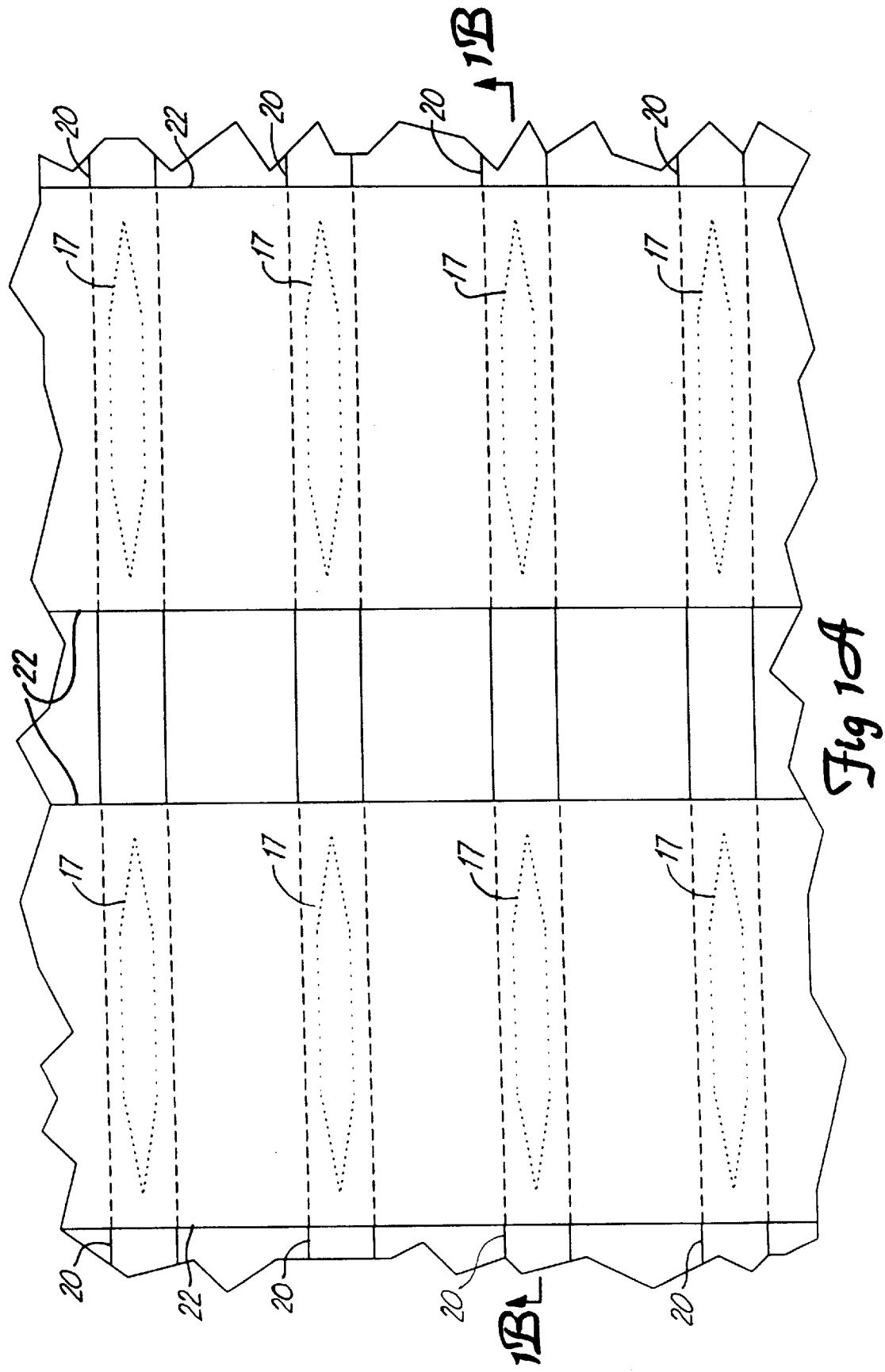

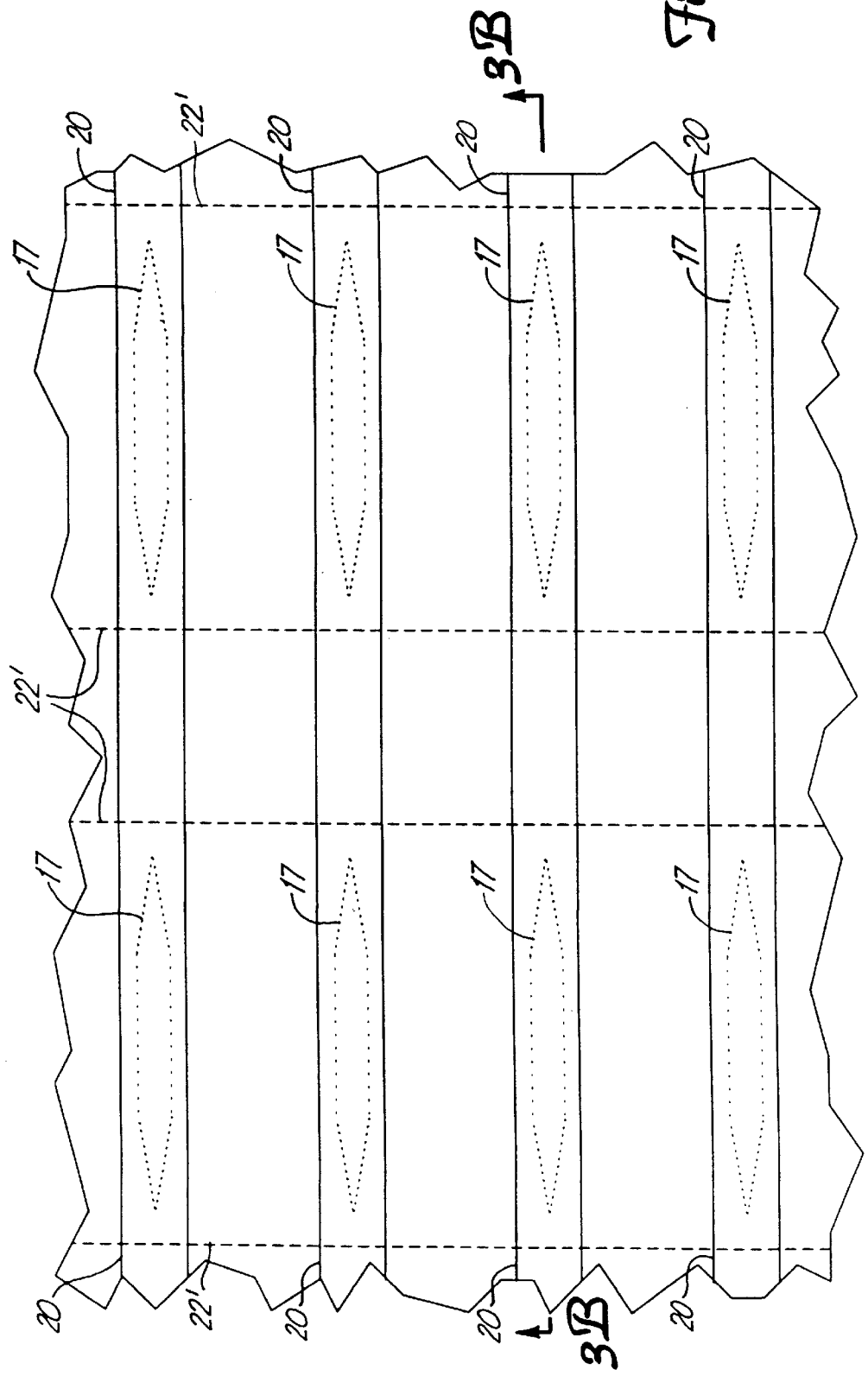

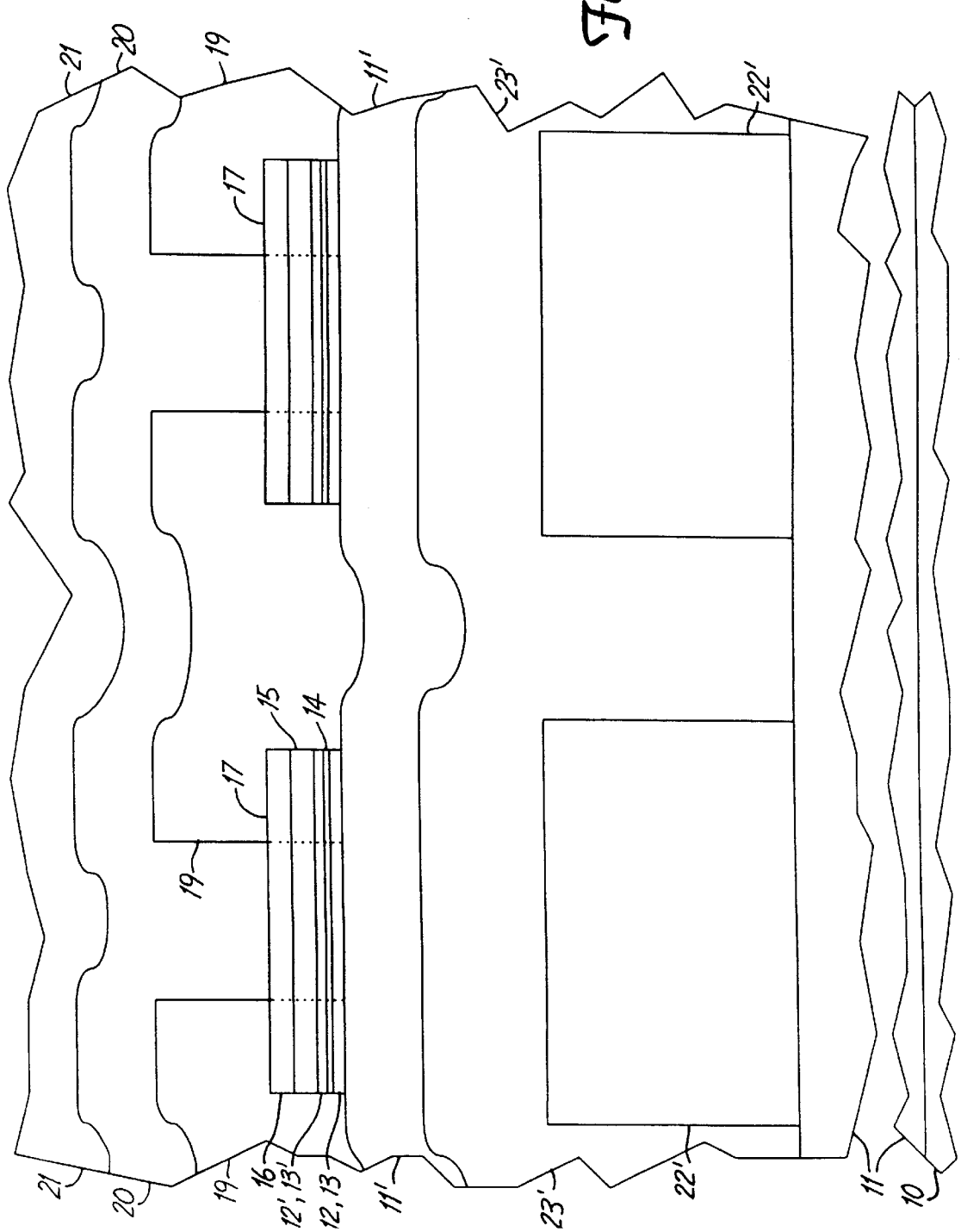

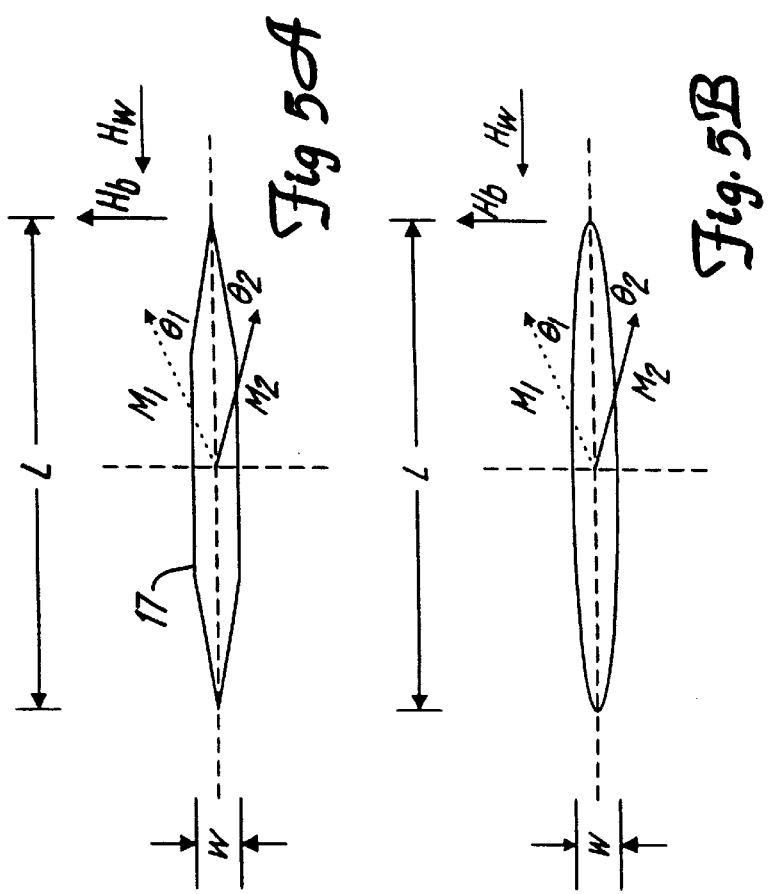
*Fig. 5A*
*Fig. 5B*
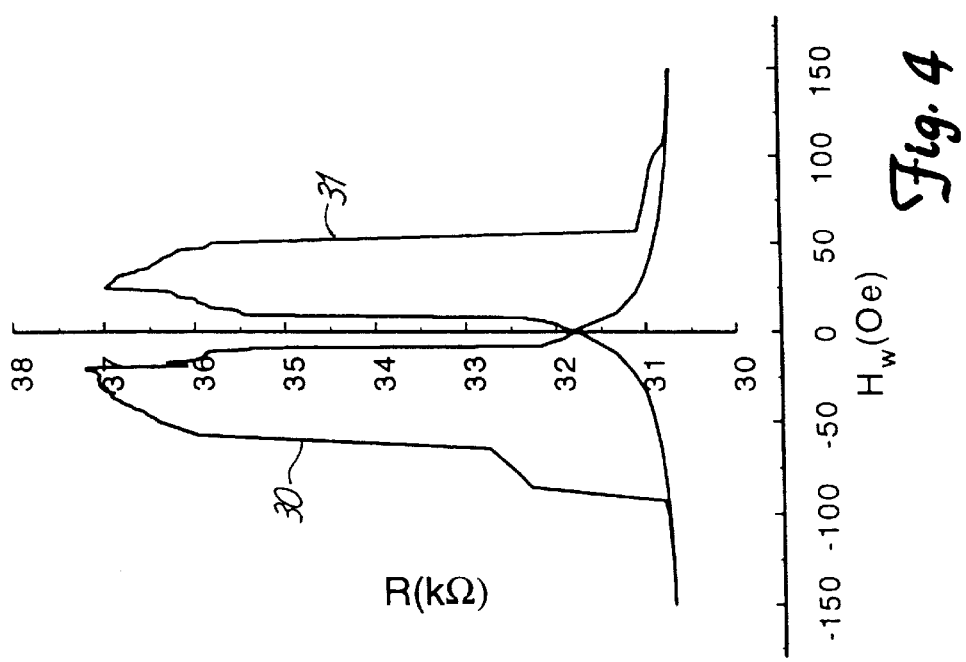
*Fig. 4*

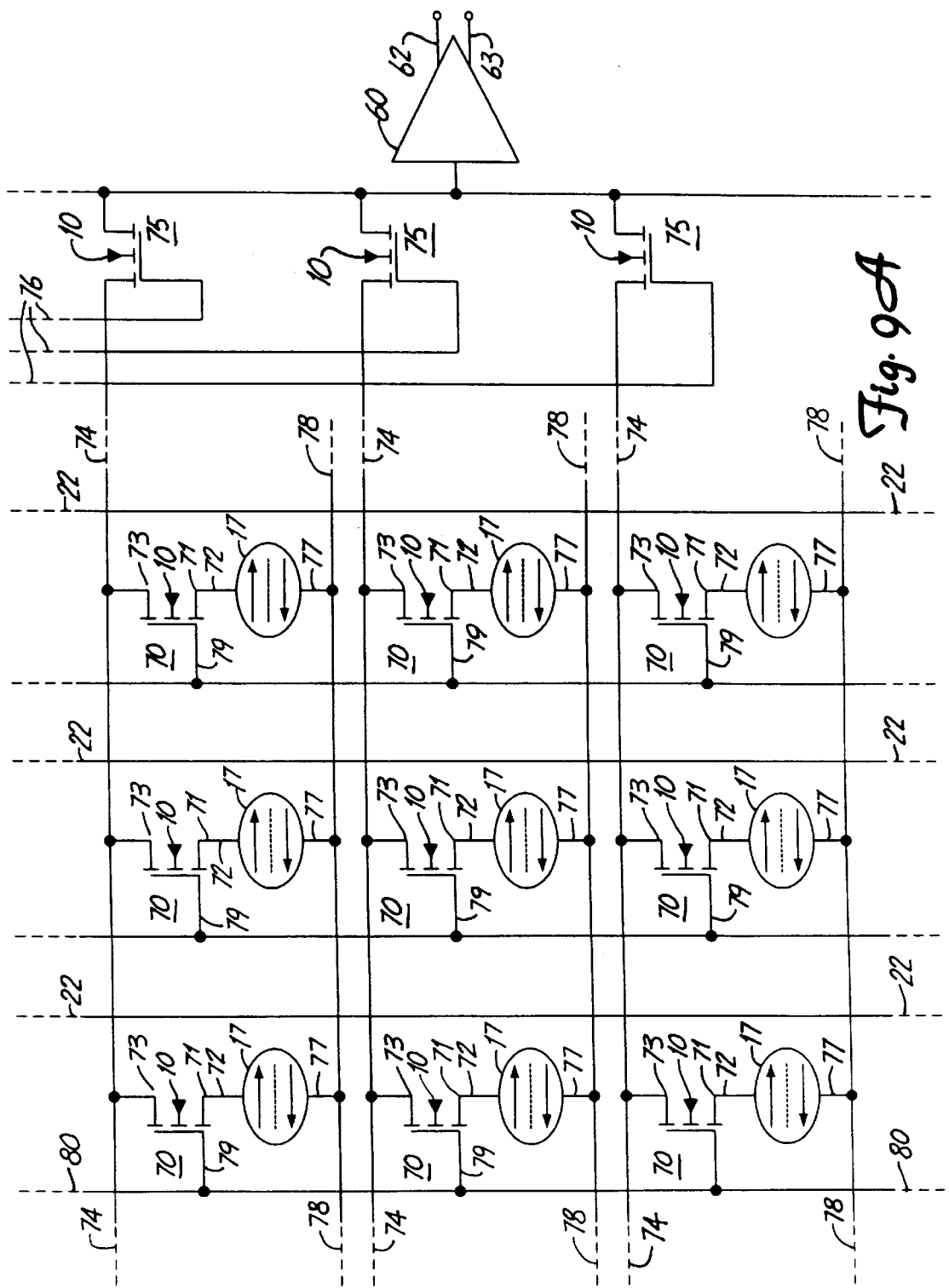

SPIN DEPENDENT TUNNELING MEMORY

CROSS-REFERENCE TO RELATED APPLICATIONS

This application claims priority from Provisional Patent Application Ser. No. 60/030,236, filed Nov. 8, 1996 for "Spin Dependent Tunneling Memory", and is a continuation-in-part of patent application Ser. No. 08/704,315, filed Sep. 6, 1996 for "Giant Magnetoresistive Effect Memory Cell."

BACKGROUND OF THE INVENTION

The present invention relates to ferromagnetic thin-film structures exhibiting relatively large magnetoresistive characteristics and, more particularly, to such structures used for the storage and retrieval of digital data.

Many kinds of electronic systems make use of magnetic devices including both digital systems, such as memories, and analog systems such as magnetic field sensors. Digital data memories are used extensively in digital systems of many kinds including computers and computer systems components, and digital signal processing systems. Such memories can be advantageously based on the storage of digital symbols as alternative states of magnetization in magnetic materials provided in each memory storage cell, the result being memories which use less electrical power and do not lose information upon removals of such electrical power.

Such memory cells, and magnetic field sensors also, can often be advantageously fabricated using ferromagnetic thin-film materials, and are often based on magnetoresistive sensing of magnetic states, or magnetic conditions, therein. Such devices may be provided on a surface of a monolithic integrated circuit to provide convenient electrical interconnections between the device and the operating circuitry therefor.

Ferromagnetic thin-film memory cells, for instance, can be made very small and packed very closely together to achieve a significant density of information storage, particularly when so provided on the surface of a monolithic integrated circuit. In this situation, the magnetic environment can become quite complex with fields in any one memory cell affecting the film portions in neighboring memory cells. Also, small ferromagnetic film portions in a memory cell can lead to substantial demagnetization fields which can cause instabilities in the magnetization state desired in such a cell.

These magnetic effects between neighbors in an array of closely packed ferromagnetic thin-film memory cells can be ameliorated to a considerable extent by providing a memory cell based on an intermediate separating material having two major surfaces on each of which an anisotropic ferromagnetic memory thin-film is provided. Such an arrangement provides significant "flux closure," i.e. a more closely confined magnetic flux path, to thereby confine the magnetic field arising in the cell to affecting primarily just that cell. This result is considerably enhanced by choosing the separating material in the ferromagnetic thin-film memory cells to each be sufficiently thin. Similar "sandwich" structures are also used in magnetic sensors.

In the recent past, reducing the thicknesses of the ferromagnetic thin-films and the intermediate layers in extended "sandwich" structures, and adding possibly alternating ones of such films and layers, i.e. superlattices, have been shown to lead to a "giant magnetoresistive effect" being present in some circumstances. This effect yields a magnetoresistive response which can be in the range of up to an order of magnitude or more greater than that due to the well known anisotropic magnetoresistive response.

In the ordinary anisotropic magnetoresistive response, varying the difference occurring between the direction of the magnetization vector in a ferromagnetic thin-film and the direction of sensing currents passed through that film leads to varying effective electrical resistance in the film in the direction of the current. The maximum electrical resistance occurs when the magnetization vector in the field and the current direction therein are parallel to one another, while the minimum resistance occurs when they are perpendicular to one another. The total electrical resistance in such a magnetoresistive ferromagnetic film can be shown to be given by a constant value, representing the minimum resistance, plus an additional value depending on the angle between the current direction in the film and the magnetization vector therein. This additional resistance has a magnitude characteristic that follows the square of the cosine of that angle.

Operating magnetic fields imposed externally can be used to vary the angle of the magnetization vector in such a film portion with respect to the easy axis of that film. Such an axis comes about in the film because of an anisotropy therein typically resulting from depositing the film during fabrication in the presence of an external magnetic field oriented in the plane of the film along the direction desired for the easy axis in the resulting film. During subsequent operation of the device having this resulting film, such operational magnetic fields imposed externally can be used to vary the angle to such an extent as to cause switching of the film magnetization vector between two stable states which occur for the magnetization being oriented in opposite directions along the film's easy axis. The state of the magnetization vector in such a film can be measured, or sensed, by the change in resistance encountered by current directed through this film portion. This arrangement has provided the basis for a ferromagnetic, magnetoresistive anisotropic thin-film to serve as a memory cell.

In contrast to this arrangement, the resistance in the plane of a ferromagnetic thin-film is isotropic for the giant magnetoresistive effect rather than depending on the direction of the sensing current therethrough as for the anisotropic magnetoresistive effect. The giant magnetoresistive effect involves a change in the electrical resistance of the structure thought to come about from the passage of conduction electrons between the ferromagnetic layers in the "sandwich" structure, or superlattice structure, through the separating nonmagnetic layers with the resulting scattering occurring at the layer interfaces, and in the ferromagnetic layers, being dependent on the electron spins. The magnetization dependant component of the resistance in connection with this effect varies as the sine of the absolute value of half the angle between the magnetization vectors in the ferromagnetic thin-films provided on either side of an intermediate nonmagnetic layer. The electrical resistance in the giant magnetoresistance effect through the "sandwich" or superlattice structure is lower if the magnetizations in the separated ferromagnetic thin-films are parallel and oriented in the same direction than it is if these magnetizations are antiparallel, i.e. oriented in opposing or partially opposing directions. Further, the anisotropic magnetoresistive effect in very thin films is considerably reduced from the bulk values therefor in thicker films due to surface scattering, whereas a significant giant magnetoresistive effect is obtained only in very thin films. Nevertheless, the anisotropic magnetoresistive effect remains present in the films used in giant magnetoresistive effect structures.

As indicated above, the giant magnetoresistive effect can be increased by adding further alternate intermediate nonmagnetic and ferromagnetic thin-film layers to extend a "sandwich" structure into a stacked structure, i.e. a superlattice structure. The giant magnetoresistive effect is sometimes called the "spin valve effect" in view of the explanation that a larger fraction of conduction electrons are allowed to move more freely from one ferromagnetic thin-film layer to another if the magnetizations in those layers are parallel than if they are antiparallel or partially antiparallel to thereby result in the magnetization states of the layers acting as sort of a "valve."

Thus, a digital data memory cell based on the use of structures exhibiting the giant magnetoresistive effect is attractive as compared to structures based on use of an anisotropic magnetoresistive effect because of the larger signals obtainable in information retrieval operations with respect to such cells. Such larger magnitude signals are easier to detect without error in the presence of noise thereby leading to less critical requirements on the retrieval operation circuitry.

A memory cell structure suitable for permitting the storing and retaining of a digital bit of information, and for permitting retrieving same therefrom has been demonstrated based on a multiple layer "sandwich" construction in a rectangular solid. This cell has a pair of ferromagnetic layers of equal thickness and area separated by a conductive nonmagnetic layer of the same shape and area parallel to the ferromagnetic layers but of smaller thickness. These ferromagnetic layers are each a composite layer formed of two strata each of a different magnetic material, there being a relatively thin ferromagnetic stratum in each of the composite layers adjacent the nonmagnetic layer and a thicker ferromagnetic stratum in each of the composite layers adjacent the thin ferromagnetic stratum therein. The ferromagnetic material of the thick stratum in one of the composite layers is the same as that in the thin stratum in the other composite layer, and the ferromagnetic material of the thin stratum in the first composite layer is the same as the ferromagnetic material in the thick stratum of the second composite layer. Each of the composite layers is fabricated in the presence of a magnetic field so as to result in having an easy axis parallel to the long sides of the rectangular solid. The dimensions of the cell structure were 10 $\mu$m in length and 5 $\mu$m in width with a nonmagnetic layer of thickness 30 Å. The composite ferromagnetic layers are each formed of a 15 Å thin stratum and a 40 Å thick stratum.

Thus, this memory cell structure has a pair of ferromagnetic layers of matching geometries but different magnetic materials in the strata therein to result in one such layer having effectively a greater saturation magnetization and a greater anisotropy field than the other to result in different coercivities in each. In addition, the structure results in a coupling of the magnetization between the two ferromagnetic layers therein due to exchange coupling between them leading to the magnetizations in each paralleling one another in the absence of any applied magnetic fields. As a result, the electrical resistance of the cell along its length versus applied magnetic fields in either direction parallel thereto is represented by two characteristics depending on the magnetization history of the cell. Each of these characteristics exhibits a peak in this resistance for applied longitudinal fields having absolute values that are somewhat greater than zero, one of these characteristics exhibiting its peak for positive applied longitudinal fields and the other characteristic exhibiting its peak for negative applied longitudinal fields. The characteristic followed by the resistance of the cell for relatively small applied longitudinal fields depends on which direction the magnetization is oriented along the easy axis for the one of the two ferromagnetic layers having the larger coercivity. Thus, by setting the magnetization of the layer with the higher coercivity, a bit of digital information can be stored and retained, and the value of that bit can be retrieved without affecting this retention through a determination of which characteristic the resistance follows for a relatively small applied longitudinal field.

Such memory cell behavior for this structure can be modeled by assuming that the ferromagnetic layers therein are each a single magnetic domain so that positioning of the magnetization vectors in the ferromagnetic layers is based on coherent rotation, and that uniaxial anisotropies characterize those layers. The angles of the magnetization vectors in the two ferromagnetic layers with respect to the easy axis in those layers are then found by minimizing the magnetic energy of these anisotropies summed with that due to the applied external fields and to exchange coupling. That total energy per unit volume is then $$E_{Tot} = E_1 + E_2 + E_{12}$$
$$= K_{u1}\sin^2\theta_1 - M_{s1}H\cos(\Psi - \theta_1) +$$
$$K_{u2}\sin^2\theta_2 - M_{s2}H\cos(\Psi - \theta_2) +$$
$$A_{12}\cos(\theta_1 - \theta_2).$$

Here, $K_{u1}$ and $K_{u2}$ are anisotropy constants, $A_{12}$ is the exchange constant, $M_{s1}$ and $M_{s2}$ are the magnetization saturation values, and H is the externally applied field. As indicated above, once the magnetization vectors have taken an angular position with respect to the easy axis of the corresponding layer at a minimum in the above indicated energy, the effective resistance between the ends of the memory cell structure is determined by the net angle between the magnetization vectors in each of these layers.

Because of the assumption of single domain behavior in the ferromagnetic layers, the above equation would seemingly be expected to improve its approximation of the assistant total magnetic energy as the length and width of that memory cell structure decreased toward having submicron dimensions. However, this mode of operation described for providing the two magnetoresistive characteristics based on the history of the layer magnetizations, in depending on the differing anisotropy fields in the two ferromagnetic layers because of the differing materials used therein, becomes less and less reliable as these dimensions decrease. This appears to occur because decreasing the cell dimensions gives rise to larger and larger demagnetizing fields in the two ferromagnetic layers which, at some point, overwhelm the effects of the anisotropy fields so that the above described behavior no longer occurs as described. In addition, the magnetizations of the two ferromagnetic layers rotate together under the influences of externally applied fields at angles with respect to the corresponding easy axis at angular magnitudes much more nearly equal to one another because of the increasing demagnetization fields in these layers as the dimensions thereof decrease. As a result, these ferromagnetic layers are less and less able to have the magnetizations thereof switch directions of orientation independently of one another as the dimensions thereof decrease so that the structure they are in becomes less able to provide the above described memory function in relying on only these ferromagnetic layer anisotropy differences.

An alternative memory cell structure which is more suited to submicron dimensions is a cell of the kind described above exhibiting "giant magnetoresistive effect" but which has the two composite ferromagnetic layers formed of different thicknesses in the thick strata therein. Thus, the thick strata in one might be on the order of 40 Å while that of the other might be on the order of 55 Å as an example. In this structure, reducing the size to submicron dimensions uses the shape anisotropy introduced by this thickness difference to provide different switching thresholds for each of the ferromagnetic composite layers in response to externally applied operating magnetic fields. The shape anisotropy leads to the effect of the demagnetizing field of one layer affecting the switching threshold of the other after the former layer has switched its magnetization direction. As a result, the thicker ferromagnetic layer has a magnetization which is fixed in orientation for externally applied operating magnetic fields that are just sufficient to switch the thinner ferromagnetic composite layer but not great enough to switch the magnetization of the thicker ferromagnetic composite layer. In effect, the demagnetizing fields as the device becomes sufficiently small dominate the anisotropy fields that result from the deposition of the ferromagnetic layers in the presence of a magnetic field.

In the absence of externally applied operating magnetic field, the two composite ferromagnetic layers have the magnetizations therein pointing in opposite directions, i.e. they are antiparallel to one another, to result in the structure as a whole having relatively small cell demagnetizing fields and small external stray fields to affect the nearby memory cells. The direction of magnetization in the thicker ferromagnetic composite layer is used to store the digital information which can only be changed in direction by externally applied fields great enough to switch magnetization directions in both composite ferromagnetic layers. That is, storing new information in the cell requires that the thicker ferromagnetic layer be capable of having the magnetization direction therein switched to be in accord with the incoming digital data.

Retrieving information from such a memory cell is accomplished by switching the magnetization direction of the thinner ferromagnetic composite layer only as a basis for determining in which direction relative to the thinner layer is the magnetization oriented in the thicker layer. Typically, both such storing and retrieving has meant that there needs to be a pair of external conductors which can coincidentally supply current to result in a field large enough to switch the magnetization of the thicker ferromagnetic composite layer, but with that current in either conductor alone being able to generate fields only sufficient to switch the threshold of the thinner ferromagnetic layer. In some situations, only a single external conductor need be provided for this purpose because the sense current used in retrieving information from the memory cell can provide the coincident current needed with the current in the external conductor to switch the magnetization direction of the thicker ferromagnetic layer. Such a memory cell is described in an earlier filed co-pending application by A. Pohm and B. Everitt entitled "Giant Magnetoresistive Effect Memory Cell" having Ser. No. 08/923,478 assigned to the same assignee as the present application and which is hereby incorporated herein.

Such a cell formed in a "sandwich" structure would typically exhibit an output signal which is on the order of a 5% to 6% change in resistance from the nominal resistance of the cell. The retrieval of data from such a cell typically requires the use of "autozeroing" circuitry which, operated prior to the retrieving step, eliminates retrieval circuit imbalances. This need coupled with the relatively large currents used in this latter kind of memory cell results in slowing the operation of that cell, and such currents also lead to substantial power dissipation. Thus, there is a desire for an alternative arrangement for such a "sandwich" structure having submicron dimensions which provide desirable magnetoresistance versus applied magnetic field characteristics that can be used for storing and retrieving bits of digital data information but which provides a larger signal with less power dissipation so that such retrievals can be done at a greater rate without undue heat generation.

SUMMARY OF THE INVENTION

The present invention provides a digital data memory having a bit structure in a memory cell based on a dielectric intermediate separating material with two major surfaces on each of which there is a anisotropic ferromagnetic thin-film but of differing moments including moment differences due to differing thicknesses. The ferromagnetic film at each such surface is a composite film having a thinner stratum of higher magnetic saturation induction adjacent the intermediate material and a thicker stratum of lower magnetic saturation induction. These bit structures are fabricated within structural extent limits to operate satisfactorily, and can be fabricated to be interconnected in various information retrieval output circuitry configurations. A corresponding conductive word line structure for each of such memory cells is positioned adjacent the ferromagnetic film on one of these surfaces but separated therefrom for use in selecting or operating corresponding ones of these memory cells, or both, in data storage and retrieval operations.

BRIEF DESCRIPTION OF THE DRAWINGS

FIGS. 1A and 1B represent a plan view of a portion of a monolithic integrated circuit structure embodying the present invention and a layer diagram of a part of this structure, FIG. 4 represents a characteristic diagram for structures similar to one of those shown in FIGS. 1A, 1B and 2, FIGS. 5A and 5B represent a plan view of a structure from FIGS. 1A, 1B and 2, and an approximation thereof, FIGS. 9A and 9B are a circuit schematic diagram of a portion of an alternative digital memory system based on the structure shown in FIGS. 1A, 1B and 2, and a layer diagram showing additional structure to that shown in FIGS. 1A, 1B and 2, FIGS. 10A and 10B are a circuit schematic diagram of a portion of an alternative digital memory system based on a structure partly similar to that shown in FIGS. 1A, 1B and 2, and a layer diagram showing that structure.

DETAILED DESCRIPTION OF THE PREFERRED EMBODIMENTS

A digital data bit storage and retrieval memory cell suited for fabrication with submicron dimensions can be fabricated that provides rapid retrievals of bit data stored therein and low power dissipation by substituting an electrical insulator for a conductor in the nonmagnetic layer. This memory cell can be fabricated using ferromagnetic thin-film materials of similar or different kinds in each of the magnetic memory films used in a "sandwich" structure on either side of an intermediate nonmagnetic layer which ferromagnetic films may be composite films, but this intermediate nonmagnetic layer conducts electrical current therethrough based primarily on a quantum electrodynamic effect "tunneling" current.

This "tunneling" current has a magnitude dependence on the angle between the magnetization vectors in each of the ferromagnetic layers on either side of the intermediate layer due to the transmission barrier provided by this intermediate layer depending on the degree of matching of the spin polarizations of the electrons tunneling therethrough with the spin polarizations of the conduction electrons in the ferromagnetic layers which are set by their magnetization directions to provide a "magnetic valve effect". Such an effect results in an effective resistance or conductance characterizing this intermediate layer with respect to the "tunneling" current therethrough. In addition, shape anisotropy is used in such a cell to provide different magnetization switching thresholds in the two ferromagnetic layers by forming one of the ferromagnetic layers to be thicker than the other. Such devices may be provided on a surface of a monolithic integrated circuit to thereby allow providing convenient electrical connections between each such memory cell device and the operating circuitry therefor.

A "sandwich" structure for such a memory cell, based on having an intermediate thin layer of a nonmagnetic, dielectric separating material with two major surfaces on each of which a anisotropic ferromagnetic thin-film is positioned, exhibits the "magnetic valve effect" if the materials for the ferromagnetic thin-films and the intermediate layers are properly selected and have sufficiently small thicknesses. The resulting "magnetic valve effect" can yield a response which can be several times in magnitude greater than that due to the "giant magnetoresistive effect" in a similar sized cell structure.

Figure 1B:
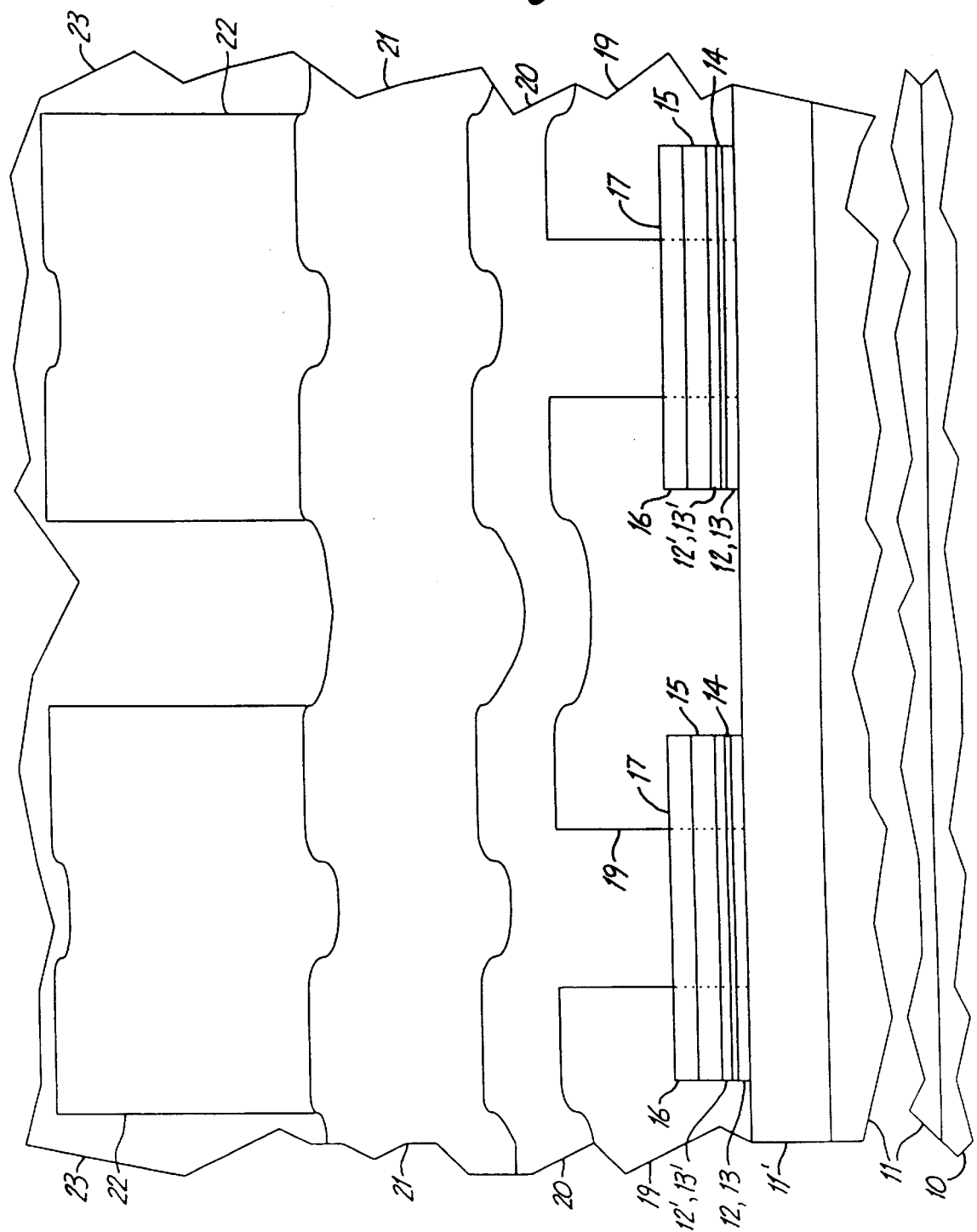

FIG. 1A shows a plan view of an example of such memory cells as part of a digital memory formed as a portion of a monolithic integrated circuit, including a supporting semiconductor chip as part of the memory substrate, which can have conveniently provided therein the operating circuitry for this memory. FIG. 1B provides a fragmentary view of a portion of the view shown in FIG. 1A to show the layered structure thereof, and also has parts thereof broken out to show some of the structure therebelow, again for greater clarity. The protective layer provided over portions of the structure shown in FIG. 1A in actual use has been omitted in this view for clarity, but that layer is shown in part in FIG. 1B. Certain other portions of some layers have been omitted, again for clarity, so that the structure portions present are shown in solid line form if they are exposed in the absence of some layer thereover now omitted, but with other structure portions beneath the solid line form portions appearing in these figures being shown in dashed line form.

Figure 2:
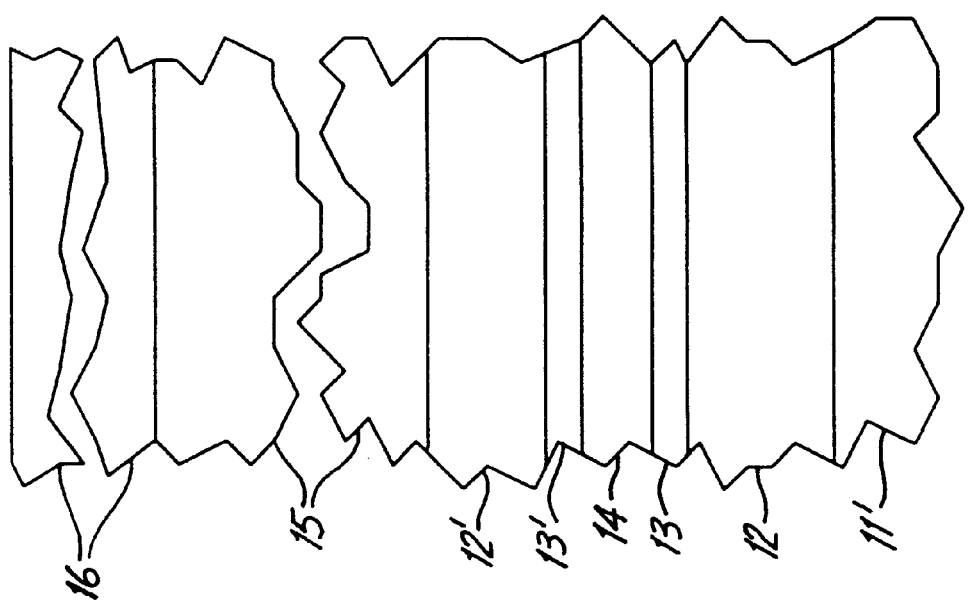
FIG. 2 represents a fragmentary portion of the layer diagram of FIG. 1B, FIGS. 3A and 3B represent a plan view of a portion of a monolithic integrated circuit structure embodying an alternative to the invention and the layer diagram of a part of this structure shown in FIGS. 1A and 1B.

Corresponding to FIGS. 1A and 1B is FIG. 2 which is a layer diagram of a corresponding portion of the structures shown in FIGS. 1A and 1B. this layer diagram gives an indication of the structural layers leading to portions of the structures shown in FIGS. 1A and 1B, but FIGS. 1B and 2 are not true cross section views in that many dimensions therein are exaggerated or reduced for purposes of clarity.

As indicated above, the memory cell structures in these figures are typically provided on a semiconductor chip, 10, having suitable operating circuitry for the memory provided in the resulting monolithic integrated circuit structure. An electrical insulating layer, 11, formed on semiconductor chip 10 by a sputter deposition of silicon nitride, supports the memory cell "sandwich" structures thereon each of which comprises a pair of ferromagnetic thin-film layers that are separated from one another by a nonmagnetic, electrically nonconductive or dielectric intermediate layer, or barrier layer, as will be described in more detail below. A portion of just layer 11 is shown in the high resolution drawing of FIG. 2. Typically, layer 11 is formed by this silicon nitride deposited to a thickness of about 10,000 Å. Photoresist is spread over layer 11 and patterned to provide via openings therethrough and through appropriate ones of the insulating layers in integrated circuit 10.

A first interconnection, 11', for the above indicated memory cell "sandwich" structures is next provided on insulating layer 11 as both this interconnection and as a further substrate portion for supporting the memory cell "sandwich" structures to be subsequently provided. Thus, a metal deposition is made on layer 11 of aluminum alloyed with 2% copper to cover that layer and fill the via openings therein for electrical interconnections to the integrated circuitry in and on the semiconductor substrate below. This metal layer is typically deposited to a thickness of 1000 Å. Photoresist is then spread thereover with openings therein where the unwanted portions of that metal layer are to be eliminated, and reactive ion etching is undertaken to provide this elimination of unwanted metal layer portions. Interconnection and support structure 11' resulting from this elimination is shown in FIGS. 1B and 2.

Thereafter, the "sandwich" structures just mentioned are provided on interconnection support layer 11' with each of the ferromagnetic thin-film layers and the intermediate layer being provided, or at least initially provided, through sputter deposition as a basis for forming a magnetoresistive memory cell. This multilayer structure will have a vertical direction effective resistivity based on the quantum electrodynamic effect tunneling current passing therethrough which might range from 0.01 to 10,000 $M\Omega\text{-}\mu m^2$ because of the extreme sensitivity of this effective resistivity to the thickness of the barrier layer. In addition, the structure will typically exhibit an effective capacitance and a magnetically controlled tunneling effect response exceeding 20% between the minimum effective resistance value and the maximum effective resistance value achievable under such control.

In this structure, the first layer provided is a composite ferromagnetic thin-film layer sputter deposited onto interconnection and support 11' with the result shown in FIG. 2. A first stratum, 12, of this composite ferromagnetic thin-film layer is formed of an alloy of 65% nickel, 15% iron and 20% cobalt deposited to a thickness of 40 Å, which has a magnetic saturation induction of typically about 10,000 Gauss, and this process results in the deposited film having a face-centered cubic structure. The deposition of this layer occurs in the presence of an external magnetic field in the plane of the film oriented along a direction parallel to the extended direction of interconnection and support 11' in FIG. 1B. This fabrication magnetic field will leave the easy axis of the film similarly directed. Alternatively, the deposition field may be provided at an angle to the extended direction of interconnection and support 11' to provide a bias rotation of the layer magnetization to facilitate switching the direction of that magnetization.

A second stratum, 13, is also provided in a sputter deposition step in the presence of a similar fabrication magnetic field. Second stratum 13 is formed of 5% iron and 95% cobalt to a thickness of 15 Å resulting in this material having a magnetic saturation induction of approximately 16,000 Gauss which is a higher value than that of the magnetic saturation induction of first stratum 12. This higher saturation material is provided adjacent the intermediate or barrier layer, which is the next layer to be formed, to thereby obtain a greater magnetically controlled tunneling effect, but the lower saturation value in stratum 12 is provided to keep the composite film more sensitive to smaller fields than it would be in its absence. This composite layer is designated 12, 13 in FIG. 1B.

Thereafter, an intermediate or barrier layer, 14, is provided by sputter deposition and oxidation onto layer 13, this intermediate layer being a dielectric. Layer 14 is begun typically by sputter depositing 12 Å of aluminum onto layer 13, and continuing to provide two further angstroms of this material using the aluminum sputtering target but also introducing oxygen into the sputtering chamber. The result is to convert the already deposited aluminum layer substantially into aluminum oxide which expands its thickness by a factor of about 1.3, and to add another two angstroms of aluminum oxide thereto giving an intermediate layer or barrier layer thickness of approximately 17.5 Å with the layer being formed primarily of aluminum oxide. Any portion of the previously deposited aluminum metal unoxidized in this process will result in a very thin layer of that aluminum on and between ferromagnetic layer 12,13 and the aluminum oxide dielectric barrier layer which can be advantageous.

The provision of layer 14 is followed by providing a second composite ferromagnetic thin-film layer that is provided on layer 14, and its structure matches that of the first composite ferromagnetic layer comprising strata 12 and 13, except for being thinner and reversed in strata order, because of the use of essentially the same deposition steps. As a result, the stratum having the greater magnetic saturation induction is again adjacent to layer 14 in the second composite layer, and the lesser magnetic saturation induction stratum is provided thereon but with a thickness of only 25 Å. Since the strata are otherwise the same, they have been designated in FIG. 2 as 13' and 12' in correspondence to strata 13 and 12.

After completing this "sandwich" structure, a 2000 Å layer of tantalum or tantalum nitride is sputter deposited on stratum 12' to passivate to protect stratum 12' therebelow, and to allow electrical connections thereto for circuit purposes. The resulting layer, 15, is shown in broken form in FIG. 2 because of its significantly greater thickness compared to the ferromagnetic composite layers and the nonmagnetic intermediate or barrier layer.

Similarly, a further layer, 16, is deposited on layer 15, and is shown in broken from in FIG. 2 because of its relatively greater thickness of 100 Å. Layer 15 is first sputter cleaned which removes around 75 Å thereof. Then, layer 16 is sputter deposited on cleaned layer 15 as a chrome silicon layer with 40% chrome and 60% silicon to serve as an etch stop for the subsequent etching of a layer to be provided thereover as a milling mask.

That is, another layer of silicon nitride is next sputter deposited on layer 16 to a depth of 1000 Å to be used as a milling mask, but this layer is not shown in FIG. 2 because its remnants will be incorporated in a further insulating layer to be provided later. On this silicon nitride mask layer, photoresist is deposited and patterned in such a way as to form a pattern for an etching mask which is to be formed following that pattern by leaving the mask portions of the silicon nitride layer therebelow after etching. This last masking pattern in the silicon nitride is to result, after milling therethrough to remove the exposed ferromagnetic and nonmagnetic layers therebelow, in a substantial number of separated bit structures to serve as the memory cells in the digital memory each with a "sandwich" construction. Reactive ion etching is used with the patterned photoresist to remove the exposed portions of the silicon nitride masking layer down to chrome silicon layer 16 serving as an etch stop. The remaining portions of the silicon nitride layer protected by the photoresist serve as the above mentioned milling mask for the subsequent ion milling step which removes the exposed portions of chrome silicon layer 16, and thereafter, also the then exposed portions of layer 15, the next exposed portions of the second composite ferromagnetic thin-film layer formed as strata 13' and 12', the subsequently exposed portions of intermediate nonmagnetic layer 14' and, finally, the resultingly exposed portions of the first composite ferromagnetic thin-film layer formed as strata 13 and 12 down to interconnection and support 11'.

A portion of one of the resulting memory cells, 17, from FIG. 1A is shown in FIG. 2, as indicated above, and has counterparts thereof shown in FIG. 1B (where they are designated again by numeral 17) with only some of the layers in each such cell being represented as distinct in this latter figure. The full multilayer structure that is shown in FIG. 2 with the distinct strata in the composite ferromagnetic layers is not shown in that manner in FIG. 1B because of the larger scale used in that figure. Some of these memory cells can also be seen in the plan view of FIG. 1A, and each of such structures is also designated by numeral 17 in that figure. The easy axes of the ferromagnetic thin-film composite layers in each of memory cells 17 are parallel to the direction of the longest extent of those structures. Each memory cell 17 is formed with a rectangular central portion in this plan view continuing into triangular portions tapering away from opposite ends of the rectangular portion along the easy axis to form the ends of the cell.

Following the completion of memory cell or bit structure 17, another layer of silicon nitride is sputter deposited over those structures and the exposed portions of interconnection and support 11' to a thickness of 7500 Å to form an insulating layer, 19. Photoresist is provided over insulating layer 19 as an etching mask to provide via openings therethrough, and through silicon nitride layer 11 and appropriates ones of insulating layers in integrated circuit 10.

On insulating layer 19, so prepared, a further metal deposition is made, again of aluminum alloyed with 2% copper, to cover that layer and fill the via openings therein, and in silicon nitride layer 11 and the insulating layers in integrated circuit 10. This metal layer is typically deposited to a thickness of 1000 Å. Photoresist is spread thereover with openings therein where the unwanted portions of that metal layer are to be eliminated, and reactive ion etching is undertaken to provide this elimination of unwanted metal layer portions. The structures that result from this elimination is shown in FIG. 1B, and in FIG. 1A, as a plurality of upper interconnections, 20, for interconnecting memory cell structure 17 in parallel to one another in conjunction with interconnection and support 11'. As a result of the via openings in silicon nitride layer 11, upper interconnections 20 are also interconnected with electronic circuitry in the integrated circuits in semiconductor substrate 10 therebelow.

The completion of upper interconnection structures 20 is followed by depositing another layer of typically 7500 Å of silicon nitride thereover, and over the exposed portions of silicon nitride layer 20 to form a further insulating layer, 21. Photoresist is provided over insulating layer 21 as an etching mask to provide via openings therethrough, and through silicon nitride insulating layers 19 and 11 as well as though appropriate ones of the insulating layers in integrated circuit 10.

On insulating layer 21, prepared in this manner, a further metal deposition is made, again of aluminum alloyed with 2% copper, to cover that layer and fill the openings therein, and in silicon nitride layers 19 and 11 as well as the insulating layers in integrated circuit 10. This metal layer is typically deposited to a thickness of 3500 Å. Photoresist is spread thereover with openings therein where the unwanted portions of that metal layer are to be eliminated, and reactive ion etching is undertaken to provide this elimination of unwanted metal layer portions. The structures that result from this elimination are shown in FIG. 1B, and in FIG. 1A, as a plurality of word lines, 22, for the memory each positioned across insulating layer 21, upper interconnection structures 20, and insulating layer 19 from corresponding memory cell structures 17 supported on and interconnected to interconnections and supports 11'. As a result of the via openings, these word lines are also interconnected with electronic circuitry in the integrated circuits in semiconductor substrate 10 therebelow. A further insulator layer, 23, is provided by sputter depositing 7500 Å of silicon nitride over word lines 22 and the exposed portions of insulator 21. Insulator 23 serves as a passivation and protection layer for the device structure therebelow. Layer 23 is seen in FIG. 1B but is not shown in FIG. 1A to avoid obscuring that figure.

A memory cell or bit structure 17 of the structure described resulting from the just described process for fabricating same will have a relatively linear change in the quantum electrodynamic effect "tunneling" current therethrough from one ferromagnetic layer to the other with respect to the voltage provided across the cell, i.e. between these ferromagnetic layers, for relatively lower voltages but the current magnitude increases more than linearly for higher values of voltage across the cell. As the voltage across the cell increases, the fractional change in the in the "tunneling" current through the cell, for the ferromagnetic layers having magnetizations changing from parallel to one another to antiparallel, decreases to being only half as great with several hundred millivolts across the cell as occurs in the situation with a hundred or less millivolts across the cell so that this fractional change with cell voltage will range from a few percent to 20% or more. The fractional change in the resistance of the cell for the ferromagnetic layers having magnetizations changing from parallel to one another to antiparallel increases to about one and one-half the room temperature values when the cell is cooled to 77° K, but the "tunneling" current through the cell increases by only about 10% to 20% indicating that the effective resistivity of the cell is relatively insensitive to temperature (around 500 to 1000 ppm/° C.).

The effective resistivity of a cell 17 is set by the amount of "tunneling" current through the cell permitted by barrier layer 14 for the voltage across the cell. The high sensitivity of the "tunneling" current to the thickness of the barrier layer leads to a wide range of cell resistivities which have been observed to be from 0.01 to 1000 M$\Omega$-$\mu$m$^2$. On the other hand, barrier layer 14 appears to permit relatively little magnetic coupling between the ferromagnetic layers thereacross with the coupling fields typically being only a few Oe.

One structural arrangement alternative to that shown in FIG. 1 that is possible is shown in FIGS. 3A and 3B. In this alternative, the word lines, now designated 22', are deposited directly on silicon nitride layer 11 with an insulating layer, now designated 23', deposited thereover to provide the supporting substrate for interconnection and support 11' and memory cells 17. Memory cells 17 are again connected parallel using interconnection and support 11' on the lower side thereof and upper interconnection 20 on the upper side thereof to provide the interconnections with memory cells 17 if connected in parallel therebetween. Insulating layer 21 now becomes the protective and passivating layer for the device. A further alternative, not shown, would be to provide word lines above and below memory cells or bit structures 17 at some angle with respect to each other, typically at right angles, for providing magnetic fields to affect the corresponding cell provided between each crossover of such word lines so that current for this purpose need not be carried in interconnection and support 11'.

The fabrication steps just described are, of course, applied to semiconductor material wafers having many integrated circuit chips therein to serve as memory substrates so that many such digital memories can be fabricated simultaneously in and on such wafers. Once all memory cell structures 17 are fabricated on each chip substrate, along with all of the associated interconnection structures and word line structures as protected by the final insulating layer, the wafers are then ready for wafer testing, for the separating of the individual devices into separate chips, and the housing of them in "packages".

The plan view of the shapes of bit structures 17, i.e. having a rectangular center portion tapering into triangular end portions at opposite ends thereof, are not the only plan view geometrical shapes which can be used. An alternative would be to form memory cell structure 17 with a plan view geometry following a parallelogram. There may be other alternative plan view shapes for memory cell structures 17 which can improve the packing density of those structures on an integrated circuit chip substrate.

A representation of a pair of typical magnetoresistance characteristics of a memory cell or bit structure 17 versus external magnetic fields applied along its length, i.e. along its easy axis, is shown in FIG. 4 for an individual bit structure example of relatively larger size rather than a smaller structure taken from a parallel string thereof as a more easily understood example. A fixed quantum effect tunneling a current of 2.0 $\mu$A is used as the operating current through the device between the upper interconnection and the lower interconnection to that device. This known current, along with the measured voltage across the cell, provides the resistance of that cell.

The characteristic, 30, having the peak on the left in FIG. 4 develops from initially having a sufficiently large magnetic field parallel to the easy axis (shown as a positive field on the plot) applied via current in the adjacent word line 22 and via interconnection and support 11' to force the magnetizations of each of the ferromagnetic thin-films 12, 13 and 13', 12' in the memory cell or bit structure 17 to be oriented in the direction of the field. These magnetizations will thus be parallel to one another pointing in an initial common direction to thereby leave the electrical resistance of the cell at a minimum (here, approximately 31 k$\Omega$).

This initial condition is followed by continually reducing this field toward zero and then reversing the field direction, after which the magnitude of the field is continually increased (shown as a negative field on the plot). As can be seen in the plot, this action begins to increase the resistance of the cell as the magnetization of thinner layer 13', 12' begins to rotate toward the opposite direction to a greater degree than does the magnetization of thicker layer 12, 13. This difference occurs because of the shape anisotropy which, as structure 17 becomes sufficiently small, dominates the material anisotropy induced by deposition of the ferromagnetic layers thereof in a magnetic field or by layer material choice or both.

As a result, these magnetizations begin to be directed more and more away from one another as the field gets increasingly negative, thereby increasing the cell resistance, until the magnetization of the thinner layer is rotated just past 90° from the easy axis, whereupon it abruptly switches (at approximately −10 Oe) to being significantly directed in the opposite direction from that of the thicker layer as it attempts to align with the fields provided by the word line and interconnection line currents. At that point, the resistance value correspondingly increases abruptly to the peak value shown of approximately 37 kΩ. The switching field threshold value is set by the bit width and the net magnetic moment of the ferromagnetic layer which in turn is set by magnitude of the saturation magnetization and the volume of that layer. Since the volume, and so the moment, can be chosen by selecting a suitable and different layer thickness with respect to that of the other layer to provide shape anisotropy, these ferromagnetic layers, even if otherwise identical, can have different switching threshold values.

As memory cells 17 are fabricated sufficiently small to be considered as having the composite layer ferromagnetic thin-films used therein to be single magnetic domain structures, the critical magnetic field magnitude (−10 Oe), or threshold, for the thinner layer at which such switching occurs (a threshold found much like the well known Stoner Wohlfarth threshold which is defined for larger area films not subject to exchange coupling and edge effects) is determined from layer magnetic energy considerations including the magnitude of the magnetic fields established by the interconnection structure current in addition to that established by the word line current. (The field due to the operating current across the intermediate layer can be neglected because this current is so relatively small). Further magnitude increases in the negative field do not, however, cause the magnetization of the thicker layer to switch to being directed in the opposite direction at the expected Stoner Wohlfarth threshold therefor because the previous switching of the magnetization direction of the thinner layer inhibits the switching of the magnetization of the thicker layer. The change in the direction of magnetic field occurring in the thicker layer due to the magnetization of the thinner layer coupled thereto, because of having been previously switched in direction, acts against the switching of the magnetization of the thicker layer to effectively increase its switching threshold.

The magnitude of the magnetic field in the thicker layer due to the magnetization of the thinner layer (and vice versa) depends on the demagnetization fields in these layers, thus allowing, by selecting the interconnection structure current magnitude and the memory cell geometry to achieve an appropriate demagnetization factor value, the setting of the degree of switching inhibition. That is, the width of the peak in characteristic 30 can effectively be set by the cell design in operating conditions. Once this elevated magnitude threshold value (approximately −70 Oe) for the thicker layer is exceeded by the magnitude of the applied field to force its magnetization direction past 90° from the easy axis, the magnetization of this layer also switches to result in the magnetizations of the two ferromagnetic thin-film layers again be oriented in a common direction (although opposite to the initial direction) to thereby sharply lower the resistance value from the peak value of approximately 37 kΩ to the relatively lower value of again about 31 kΩ. Further increases in the magnitude of the negative field do not significantly further change the resistance value as the magnetization directions in each layer are forced slightly closer and closer to a common direction. Since the direction of the magnetization of thicker layer 12, 13 can only be switched by fields having magnitudes greater than those that switch the magnetization direction of thinner layer 13', 12', the direction of magnetization of thicker layer 12, 13 effectively determines the binary value, "0" or "1", of the data bits stored in the cell.

Hence, traversing this large portion of characteristic 30 shown in FIG. 4 by changing the externally applied magnetic field due to word line current from a relatively large positive magnitude to a relatively large negative magnitude in the presence of a sufficient interconnection structure current is equivalent to changing the magnetic state of both layers from pointing in one direction to pointing in the opposite direction, i.e. to storing a new data bit by changing the previously stored data therein based on the direction of the magnetization from its initial direction and binary value to another direction and value. If the initially stored data bit value was the same as the new value to be stored, the corresponding increase in the externally applied field magnitude in the opposite direction to store this new data bit, i.e. the increasing of the field in a positive direction rather than in the negative direction as described above, would not cause traversing the peak in characteristic 30 thus leaving the layer magnetization's direction and the data bit value unchanged.

The remaining characteristic, 31, in FIG. 4 develops just as did characteristic 30 if started from where the development of characteristic 30 terminated as described above, that is, by applying a positively increasing magnitude field in the presence of a sufficient interconnection structure current based field magnitude after the occurrence of a large magnitude negative field. Again, the peak in the cell resistance arises in this characteristic by first encountering a threshold like and near to a Stoner Wohlfarth threshold for switching thinner ferromagnetic layer 13', 12' (approximately 8 Oe) to increase the cell resistance from again about 31 kΩ to around 37 kΩ, and thereafter encountering the elevated magnitude threshold for switching thicker layer 12, 13 (approximately 58 Oe) to decrease the cell resistance back to about 31 kΩ. Thus, storing a data bit of either a "0" or "1" binary value in a memory cell 17 having the characteristics shown in FIG. 4, as represented by the orientation direction of the magnetization of thicker layer 12, 13 along its easy axis in the scheme just described, requires the application of a sufficient magnitude word line field in the corresponding direction along that axis in the presence of a sufficient magnitude interconnection and support structure field.

Retrieving the stored data without disrupting the value of that data is easily done in a memory cell or bit structure 17 having characteristics 30 and 31, the current one of these characteristics that the cell resistance will follow upon application of interconnection support current and word line current based fields having been determined by the direction of orientation of the last external field applied to the cell sufficiently large to switch the magnetizations of both cell ferromagnetic thin-film layers in the presence of the chosen interconnection and support line current. A limited externally applied field, the limit imposed by limiting the corresponding word line current and possibly the interconnection and support line current in the presence of the interconnection and support line current chosen is initially provided having a value capable of placing the resistance of the cell at one of its peak values in either one or the other of characteristics 30 and 31, and the cell structure voltage measuring circuitry may be concurrently "autozeroed" to thereby measure a zero value in these circumstances.

Such "autozeroing" circuitry and processing need not be used for a single cell because of the relatively large signal change provided thereby, but the use of several such cells in parallel with one another in the circuit to which the voltage measuring circuitry is applied will reduce the output signal of a cell because of the parallel conduction paths to a value sufficiently small so as to require "autozeroing" if the individual cells in that circuit are not electrically isolated from one another such as by use of a switching arrangement or other electrical isolating means. Of course, the ability to dispense with the need to perform an "autozeroing" step and to eliminate the circuitry therefor can significantly increase the information retrieval rate in the memory cell circuit as well as allowing an increase in the density thereof in a monolithic integrated circuit chip. This initial field is limited in magnitude so as to be unable to switch the direction of magnetization of thicker layer 12, 13 in the presence of chosen interconnection and support line current magnitude.

To complete retrieving the stored cell information, the limited externally applied field is then reversed from its initial direction to a final limited value in the opposite direction that is capable of placing the resistance of the cell at its other characteristic resistance peak, but not capable of switching the direction of magnetization of thicker layer 12, 13 in the presence of the chosen interconnection and support line current magnitude. If the cell resistance is actually at a resistance peak initially in following one of characteristics 30 or 31 because of the direction of the last previously applied word line current base field of a magnitude sufficient to switch magnetizations of both ferromagnetic layers, the resistance after the field reversal will decrease as the magnetization of the thinner layer switches to be oriented in the same direction as the direction of magnetization of the thicker layer. If the cell resistance is instead following the other characteristics so that it exhibits a relatively low resistance initially, the resistance after the field reversal will increase as the magnetization of the thinner layer switched to be oriented in the direction opposite to the direction of the magnetization of the thicker layer.

Thus, the resistance change on the reversal from a field oriented in one direction of a magnitude limited to be at a resistance characteristic peak to a limited field oriented in the opposite direction will indicate which of the characteristics 30 and 31 the cell followed, and so in what direction the last sufficiently large externally applied magnetic field was oriented to thereby indicate the binary value of the data bit represented thereby. The change in the resistance value, $\Delta R$, is equal to the full change in resistance between the peak resistance value, representing the ferromagnetic layers magnetizations being opposed in direction to one another, to the relatively low resistance value representing the layer magnetizations being oriented in the same direction as one another. This retrieval process provides a bipolar output indication since an increase of this magnitude indicates one stored data bit value and a decrease indicates the opposite stored data bit value. Thus, the difference between the magnetic state indication representing by an increase in resistance, $+\Delta R$, and the magnetic state indication represented by a decrease in resistance, $-\Delta R$, is $+\Delta R-(-\Delta R)=2\Delta R$, or twice the resistance change value to give the voltage measuring circuitry across the cell structure a readily detectable state differentiating output signal to measure from its "auto-zeroed" initial measuring point.

The rapidity at which such a binary data retrieval operation can be performed in such a memory cell or bit structure 17 is initially limited by the rise time of the currents in interconnection and support 11' and in word line 22, and by the time required to rotate the magnetization vectors in the ferromagnetic layers in response to such a current. However, such a minimum data retrieval time limit on the duration required to retrieve the data can be further lengthened by the response time of the memory cell or bit structure 17 due to the capacitive nature of that cell in having a pair of ferromagnetic conductors on either side of a dielectric layer yielding an effective capacitance. An important parameter for memory cell or bit structure 17 is the intrinsic resistance-capacitance time constant of the device due to that barrier layer 14 resulting therein from the fabrication process of the cell. The cell capacitance, C, can be approximately determined for the cell from $$C = 8.85 \cdot 10^{-18} \cdot 8 \cdot 10^{-6} \, A/s$$

where A is the area in square microns and s is the thickness of the aluminum oxide portion of barrier layer 14 in microns and a dielectric constant of 8 has been taken as the value appropriate for the aluminum oxide of barrier layer 14. As indicated above, for relatively low voltages across the cell (100 mV or less), the effective resistance through the cell, R, will typically be on the order of $10^4$ to $10^9$ $\Omega$. The resistance of this portion of the barrier layer can be approximated by $$R = k_1 s e^{k_2 s}$$

where $k_1$ and $k_2$ are constants characterizing the barrier layer material and s again is the thickness of that layer in microns. As a result, the resistance-capacitance time constant which is the product of R and C will then be exponentially dependent on the thickness s of the aluminum oxide portion of barrier layer 14. This time constant product can be reduced by reducing the thickness of the aluminum oxide portion of barrier layer 14 until $k_2 s$ is much smaller than 1, or, as a practical matter, until difficulties in the fabrication process of thin barrier layers prevent further reductions in the thickness thereof.

A further lengthening in the minimum time to retrieve data from a memory cell or bit structure 17 will be due to the voltage measuring circuitry across the cell involving a sensing amplifier to detect the change in the output voltage of that cell when the magnetizations of the ferromagnetic layer are changed from parallel to one another to being antiparallel. Such a sensing amplifier will have an input resistance $R_a$ typically equal to the combined resistances of the cells connected thereto to provide approximately the maximum energy transfer from the cell to the amplifier.

If a single cell 17 is operated by a current source providing a current value of I therethrough, the voltage across the cell will increase from $I/G_{max}$ to a value of $I/(G_{max}-\Delta G)$ where $G_{max}=1/R_{min}$ if an information retrieval operation results in the cell resistance going from $R_{min}$ to $R_{min}+\Delta R$. The effective resistance-capacitance time constant of the cell alone in an information retrieval output circuit having a matching input resistance to provide maximum energy transfer for this increase in voltage forming the cell output signal voltage will be equal to about C/2G where C includes the capacitance of the cell as well as the input capacitance of the sensing amplifier. Alternatively, one may instead choose the amplifier input impedance to minimize the noise generated rather than to maximize the power transfer and, as a result, increase the time constant by as much as two.

If the aluminum oxide portion of barrier layer 14 has a thickness of 2 nm to give a value for C of approximately 0.035 pF (ignoring the input capacitance of the sensing amplifier) from the above expression therefor, and the cell exhibits a resistance value from $10^4$ to $10^9$ Ω for a cell having an area A of one square micron from the above expression therefor, the value of the resistance-capacitance time constant for the voltage rise on the cell through the sensed amplifier would be between 0.35 ns and 35,000 ns. The need to be competitive with information retrieval times of other kinds of random access memory requires that the effective resistance of a memory cell 17 be much closer to the value of $10^4$ Ω then to $10^9$ Ω to provide competitive data retrieval times, and so the aluminum oxide portion of barrier layer 14 must be sufficiently thin.

A further parameter to consider with a memory cell or bit structure 17 is the associated electrical noise and its relationship to the available signal voltage change in switching the magnetizations of the ferromagnetic layers therein from anti-parallel to parallel. This signal voltage is, as can be seen from the foregoing, for a cell 17 with a fixed current therethrough that results in approximately 100 mV being dropped across the cell (the value of voltage above which the response to a switching of the ferromagnetic layer magnetizations decreases) will be the cell voltage response to the magnetization direction switching multiplied by 100 mV. If the ferromagnetic layer paralleling switching response is 20%, the voltage change signal from the cell will be 20 mV. The noise voltage, on the other hand, is strongly related to the equivalent resistance R of the cell and the bandwidth, Δf, effective in the information retrieval output circuitry which noise voltage is known from electrical noise theory to at room temperature, be $$V_n = 1.26 \cdot 10^{-10} F \cdot (R_{min} \cdot \Delta f)^{1/2},$$

where F is the noise factor of the voltage retrieval circuitry system having a minimum value of unity. If the bandwidth Δf is taken to be 100 μHz, as is typical in random access memory data retrieval circuitry systems, the foregoing expression can be written as $$V_n = 1.26 \cdot 10^{-6} \cdot F \cdot R_{min}^{1/2}.$$

Clearly, the signal-to-noise ratio can be improved by making a memory cell or bit structure 17 of larger area to give a lower resistance, and therefore a lower noise voltage. For instance, a signal-to-noise ratio of 20, which is a value typically found sufficient for a random access memory to provide a low error rate, the above signal value of 20 mV requires a noise voltage value for $V_n$ which is less than 1mV for a noise factor value of the minimum value 1. This requires that $R_{min}$ have a value which is less than 890 kΩ. If the cell has a resistivity of 1000 μΩ-μm², memory cell 17 would have to have an area of 1122 square microns. On the other hand, a cell resistivity of 0.1 μΩ-μm² would result in a memory cell needing to have an area of only 0.1 square microns. Again, the aluminum oxide portion of barrier layer 14 must be thin enough to permit use of a memory cell having a sufficiently small area to result in a memory on a monolithic integrated circuit chip having a sufficiently high memory cell density.

As to the cell resistance versus applied external magnetic field characteristics of a cell 17, magnetic structures are known, from thermodynamic considerations, to have stable equilibrium states of magnetization at minimums of the free energies of those structures. The total free energy of a bit structure or memory cell 17 can be given generally as $$E_{Tot} = E_1 + E_2 + E_{12}.$$

where the total free energy is represented by $E_{Tot}$ the self-energy of the first and second layers is represented by $E_1$ and $E_2$, respectively, and the interaction energy between the two layers is represented by $E_{12}$. As indicated above, a reasonable approximation for the structure of a bit structure 17 is to assume that the ferromagnetic thin-film layers therein are each of a single domain allowing the assumption that the magnetization of a layer changes only by rotation, and that these layers exhibit uniaxial anisotropy. These and further other reasonable approximations, such as assuming there is no magnetic energy at present due to magnetostriction or to other causes and that the operating current through barrier or intermediate layer 14 essentially perpendicular to the ferromagnetic films provides a negligible magnetic field, allows an analytic representation of the behavior of a bit structure or memory cell 17 that rather closely matches the characteristics shown in FIG. 4. The expressions provided for this purpose representing these energies will be based on the bit structure shown in FIG. 5A as taken from bit structures 17 shown in FIGS. 1A and 1B.

The self-energy for this purpose of thicker ferromagnetic thin-film composite layer 12, 13, designated here as the first layer, can be represented as $$E_1 = \frac{H_{k1} M_{s1} V_1}{2} \sin^2(\theta_1 - \theta_S) + \frac{D_{1L} M_{s1}^2 V_1}{2} \sin^2(\theta_1) +$$

$$\frac{D_{1w} M_{s1}^2 V_1}{2} \cos^2(\theta_1) + H_w M_{s1}^2 V_1 \cos(\theta_1) + H_b M_{s1} V_1 \sin(\theta_1),$$

and the self-energy of thinner ferromagnetic thin-film composite layer 13', 12' considered the second layer can be similarly written as $$E_2 = \frac{H_{k2} M_{s2} V_2}{2} \sin^2(\theta_2 - \theta_s) + \frac{D_{2L} M_{s2}^2 V_2}{2} \sin^2(\theta_2) +$$

$$\frac{D_{2w} M_{s2}^2 V_2}{2} \cos^2(\theta_2) + H_w M_{s2} V_2 \cos(\theta_2) + H_b M_{s2} V_2 \sin(\theta_2).$$

The first term in each of these self-energy expressions represents the anisotropy energy in the corresponding one of the layers due to the anisotropies present therein, primarily the anisotropy brought about by the deposition of these ferromagnetic films in the presence of a magnetic field leading to requiring energy to deviate the magnetization of the film from the easy axis therein established by such deposition. The effects of such anisotropies are cumulatively represented in a well known manner by an effective anisotropy field in each layer, $H_{k1}$ and $H_{k2}$, respectively, multiplied by the saturation magnetization of that layer which is $M_{s1}$ for layer 1 and is $M_{s2}$ for layer 2. The angle between the magnetization of the first layer, $M_1$, shown by a dashed line vector in FIG. 5A, and the average easy axis is represented by $\theta_1$. The angle between the magnetization of the second layer, $M_2$, shown by a solid line vector in that figure, and the average easy axis is represented by $\theta_2$. The volume of each layer, $V_1$ for layer 1 and $V_2$ for layer 2, multiply the respective terms to give the total anisotropy energy in each corresponding layer. To provide an initial rotation bias for the magnetizations in the opposite directions in the two ferromagnetic layers, the easy axis of each layer is rotated on angle $\theta_s$ during fabrication. Such a bias reduces switching thresholds in cells 17.

The second and third terms in each of the last two energy expressions represent the demagnetization self-energy for each of the corresponding layers in a form typically written therefor. In these terms, the symbols $D_{1L}$ and $D_{2L}$ each represent the demagnetization factor corresponding to the length axis for the pertinent one of the first and second ferromagnetic thin-film layers in bit structure 17. The symbols $D_{1W}$ and $D_{2W}$ in these terms each represent the demagnetization factors corresponding to the width axis for the related layer.

The fourth terms of each of these expressions represent the energy of the magnetization in the corresponding layer due to the current applied in the associated word line 22 to generate a magnetic field, $H_w$, shown directed from right to left in FIG. 5A. Should a meander word line be used, the field contribution from current in that line would be merely added to, and part of, the field $H_w$ supplied by the current through word line 22 over the corresponding bit structure 17.

The last term in each of these expressions represents the energy of the magnetization in the corresponding layer due to an effective bias current being also carried in upper interconnection 20 (which could be instead carried in interconnection and support 11') as described above if any, this field being designated by $H_b$ and represented in FIG. 5A by an upward pointing solid line arrow assuming current flow in that bias line is from left to right. Such a bias field can used to aid in switching the direction of magnetization of the thicker ferromagnetic layer.

The interaction energy between the two ferromagnetic thin-film layers in a bit structure or memory cell 17 is given by $$E_{12} = -H_e V_{avg} M_{s-avg} \cos(\theta_1 + \theta_2) - \frac{V_1 D_{2w} + V_2 D_{1w}}{2} M_{s1} M_{s2} \sin(\theta_1)\sin(\theta_2) + \frac{V_1 D_{sL} + V_2 D_{1L}}{2} M_{s1} M_{s2} \cos(\theta_1)\cos(\theta_2).$$

The first term in this interaction energy expression accounts for the exchange coupling energy and the correlated surface waviness (textural variation) coupling energy which is represented by an effective exchange field, $H_e$, in the usual manner to cover these couplings between the ferromagnetic thin-film layers. This term is multiplied by the average volume and magnetization of both of these layers, or $$V_{avg} = \frac{V_1 + V_2}{2}$$

and $$M_{s-avg} = \frac{M_{s1} T_1 + M_{s2} T_2}{T_1 + T_2}.$$

The last two terms in the ferromagnetic layer interaction energy expression represent the effects of the magnetization in one layer upon the magnetization in the other analogous to the well known dipole-dipole interaction through considering the magnetization in each layer as a dipole interacting with the magnetization in the other. Because of the extremely close proximity of the two ferromagnetic layers, the effective field in one layer due to the demagnetization field in the other is taken to be identical to that source demagnetization field, ignoring any effects of the separation. These terms are responsible for the switching inhibition described above (and some rotation aiding) leading to the elevated magnitude threshold faced in switching the direction of magnetization of thicker ferromagnetic layer 12,13 when the magnetization of thinner layer 13', 12' is directed oppositely to that of the thicker layer.

Ferromagnetic material masses of general shapes in a magnetic field lead to very complex demagnetization factors characterizing the internal response of that mass to the field. Homogeneous bodies having surfaces characterizable by expressions in the second degree lead to demagnetization factors in uniform fields which are much more tractable, i.e. the magnetization factors for ellipsoids have been determined in analytical closed form. As can be seen in FIG. 5B, an ellipsoid can be provided with corresponding ones of its axes numerically equal to the length, width and thickness of the ferromagnetic thin-film layers in bit structure 17 of FIG. 5A. The resulting ellipsoid can be seen to rather closely approximate those layers in viewing FIGS. 5A and 5B together, at least for thinner composite ferromagnetic layer 13', 12' exposed in FIG. 5A. However, the length and width of thicker ferromagnetic composite thin-film layer 12,13 is the same as that of layer 13', 12' and the thickness differences between the two layers are easily accounted for by the different dimensions of the third axis of the ellipsoids used to represent them to reflect the difference between the thicknesses of those layers. The resulting demagnetization factors are $$D_{1L} = \frac{4\pi \cos(\phi)\cos(\zeta_1)}{\sin^3(\zeta_1)\sin^2(\alpha_1)} [F(k_1, \zeta_1) - E(k_1, \zeta_1)]$$

and $$D_{2L} = \frac{4\pi \cos(\phi)\cos(\zeta_2)}{\sin^3(\zeta_2)\sin^2(\alpha_2)} [F(k_2, \zeta_2) - E(k_2, \zeta_2)]$$

for the demagnetization factors corresponding to the lengths of the ellipsoids representing the two ferromagnetic thin-film layers of memory cell 17 in FIG. 5A, and $$D_{1W} = \frac{4\pi \cos(\phi)\cos(\zeta_1)}{\sin^3(\zeta_1)\sin^2(\alpha_1)\cos^2(\alpha_1)} \times \left[ E(k_1, \zeta_1) - \cos^2(\alpha_1)F(k_1, \zeta_1) - \frac{\sin^2(\alpha_1)\sin(\zeta_1)\cos(\zeta_1)}{\cos(\phi)} \right]$$

and $$D_{2W} = \frac{4\pi \cos(\phi)\cos(\zeta_2)}{\sin^3(\zeta_2)\sin^2(\alpha_2)\cos^2(\alpha_2)} \times \left[ E(k_2, \zeta_2) - \cos^2(\alpha_2)F(k_2, \zeta_2) - \frac{\sin^2(\alpha_2)\sin(\zeta_2)\cos(\zeta_2)}{\cos(\phi)} \right]$$

for the demagnetization factors corresponding to the widths of these ellipsoids for these layers.

In these equations for the demagnetization factors, the various trigonometric terms, $\cos(\phi)$, $\cos(\zeta_x)$, and $\sin(\alpha_x)$, are defined as $$\cos(\phi) = \frac{W}{L} \left(0 \le \phi \le \frac{\pi}{2}\right),$$

$$\cos(\zeta_x) = \frac{T_x}{L} \left(0 \le \zeta_x \le \frac{\pi}{2}\right),$$

and $$\sin(\alpha_x) = \left[\frac{1-\left(\frac{W}{L}\right)^2}{1-\left(\frac{T_x}{L}\right)^2}\right]^{\frac{1}{2}} = \frac{\sin(\phi)}{\sin(\zeta_x)} = k_x \left(0 \le \alpha_x \le \frac{\pi}{2}\right).$$

where L is the length of the ellipsoid, W is the width of the ellipsoid, and $T_x$ represents the thicknesses of either of the two approximating ellipsoids through x being set to either 1 or 2 to indicate the first or second layer. The functions denoted by $F(k_x, \zeta_x)$ and $E(k_x, \zeta_x)$ are elliptic integrals of the first kind and the second kind, respectively, defined as $$F(k_x, \zeta_x) = \int_0^{\zeta_x} \frac{1}{\sqrt{1 - k_x^2 \sin^2(\psi)}} d\psi$$

and $$E(k_x, \zeta_x) = \int_0^{\zeta_x} \sqrt{1 - k_x^2 \sin^2(\psi)} \, d\psi$$

These expressions for the demagnetization factors can be further simplified in several situations, including the present situation where the length and width are of comparable magnitudes but each are more than an order of magnitude greater than the thickness, i.e.

$L \ge W >> T_x$.

In this circumstance, the demagnetization factors can be expressed as $$D_{1L} = 4\pi T_1 \frac{(1-e^2)^{\frac{1}{2}}}{L} \frac{K - E_c}{e^2} = 4\pi T_1 F_L$$

and $$D_{2L} = 4\pi T_2 \frac{(1-e^2)^{\frac{1}{2}}}{L} \frac{K - E_c}{e^2} = 4\pi T_2 F_L$$

for the demagnetization factors corresponding to the lengths of the ellipsoids representing the corresponding one of the two ferromagnetic layers, and $$D_{1W} = 4\pi T_1 \frac{E_c - (1-e^2)K}{Le^2(1-e^2)^{\frac{1}{2}}} = 4\pi T_1 F_W$$

and $$D_{2W} = 4\pi T_2 \frac{E_c - (1-e^2)K}{Le^2(1-e^2)^{\frac{1}{2}}} = 4\pi T_2 F_W$$

for the demagnetization factors corresponding to the widths of these ellipsoids representing those layers. In these last equations for the demagnetization factors, the symbol e is defined as $$E = \left(1 - \frac{W^2}{L^2}\right)^{\frac{1}{2}}.$$

The functions K and $E_c$ are complete elliptic integrals given as $$K = \int_0^{\frac{\pi}{2}} \frac{1}{\sqrt{1 - e^2 \sin^2(\psi)}} d\psi$$

and $$E_c = \int_0^{\frac{\pi}{2}} \sqrt{1 - e^2 \sin^2} \, d\psi.$$

Using these last expressions for the demagnetization factors, the above expressions for the energy components in the free energy of the bit structures 17 of FIG. 5A can be rewritten to in simplified form. The self-energy of ferromagnetic thin-film layer 12,13 becomes $$E_1 = \frac{H_{k1} M_{s1} V_1}{2} \sin^2(\theta_1 \theta_s) + \frac{4\pi T_1 F_L M_{s1}^2 V_1}{2} \sin^2(\theta_1) +$$
$$\frac{4\pi T_1 F_W M_{s1}^2 V_1}{2} \cos^2(\theta_1) + H_w M_{s1} V_1 \cos(\theta_1) + H_b M_{s1} V_1 \sin(\theta_1).$$

The expression for the self-energy of layer 13', 12' now is $$E_2 = \frac{H_{k2} M_{s2} V_2}{2} \sin^2(\theta_2 \theta_s) + \frac{4\pi T_2 F_L M_{s2}^2 V_2}{2} \sin^2(\theta_2) +$$
$$\frac{4\pi T_2 F_W M_{s2}^2 V_2}{2} \cos^2(\theta_2) + H_w M_{s2} V_2 \cos(\theta_2) + H_b M_{s2} V_2 \sin(\theta_2).$$

Finally, the interaction energy expression becomes $$E_{12} = -H_e V_{avg} M_{avg} \cos(\theta_1 + \theta_2) -$$
$$\frac{V_1 4\pi T_2 F_w + V_2 4\pi T_1 F_{wl}}{2} M_{s1} M_{s2} \sin(\theta_1) \sin(\theta_2) +$$
$$\frac{V_1 4\pi T_2 F_L + V_2 4\pi T_1 F_L}{2} M_{s1} M_{s2} \cos(\theta_1) \cos(\theta_2)$$

or $$E_{12} =$$
$$-H_e V_{avg} M_{avg} \cos(\theta_1 + \theta_2) - \frac{V_1 T_2 + V_2 T_1}{2} 4\pi F_w M_{s1} M_{s2} \sin(\theta_1) \sin(\theta_2) +$$
$$\frac{V_1 T_2 + V_{21} T}{2} 4\pi F_L M_{s1} M_{s2} \cos(\theta_1) \cos(\theta_2).$$

Some limitations must be satisfied by bit structures 17 to have them behave during digital data storage and retrieval operations as desired. The width dimension W thereof is subject to at least two conditions which limit its extent to being less than certain values. As indicated above in describing the operating process, the switching of the directions of the magnetizations of the layers at certain threshold values of the word line current based fields depends on the magnitude of the bias fields due to the bias current since these bias fields affect those thresholds. The ability of the fields generated by the bias currents to affect the thresholds will be diminished and eventually disappear or become negligible as the width dimension of bit structure 17 become increasingly wide. This begins to occur when the width of the bit structure exceeds twice the curling length experienced in that structure for the magnitude of the word line current based field used for switching the directions of the layer magnetizations.

The magnetizations of portions near the sides of a bit structure 17 are pinned there in a direction parallel to the sides to a greater extent than those in the interior of the structure because of demagnetization considerations. Thus, as the structure widens, the applied field will at some point switch the magnetization of the layers in the interior central portions thereof without having switched the magnetizations of the layer portions near the edges thereof. As a result, the fields due to the bias current, which are orthogonal in direction to those induced by the word line currents, tend to interact with the magnetizations of the ferromagnetic layers in two counteracting ways rather than in one supporting way. That is, the fields due to the bias current will cause torques on the magnetizations already rotated in the central interior portions in one direction, but cause torques on the magnetizations at the edges in an opposite direction to thereby in effect cancel out the torques on the magnetizations. The intent is instead to have the torques generated by the bias current fields act in a common direction to aid the switching of the magnetizations under the applied word line current fields. Hence, the width of bit structure 17 should be no greater than twice such curling lengths occurring therein from its sides inward. If the width of a bit structure 17 is less than twice the curling length's characteristic thereof, the magnetizations of the layers, both in the central interior portions and near the outer side portions thereof, rotate together and so are subject to torques from the field generated by the bias current in a common direction.

On the other hand, the bias current can be kept sufficiently small so as not to be a significant factor in determining the magnetization direction switching thresholds, particularly when a meander word line is used. In any event, suitable operation of bit structure 17 as described above requires that demagnetizing fields be of sufficient magnitude to serve to inhibit the switching of the thicker ferromagnetic thin-film layer magnetization once the magnetization of the thinner layer has already been oppositely directed as described above. This inhibition is due primarily to the demagnetizing field components that parallel the width dimension of bit structure 17 since these demagnetizing fields will be considerably greater in magnitude than those along the length of that structure given that the width has significantly smaller extent than does the length. To assure that the demagnetizing fields associated with the width are dominant with respect to the anisotropy fields occurring in the layers, a bit structure 17 is required to have a width sufficiently small to result in the width component demagnetization field being larger than the anisotropy field for the layer, or that $H_{dx}$, representing the demagnetization field along the widths, be greater than $H_{kx}$ leading to $$H_{dx} = D_{xw} M_{sx} = 4\pi T_x F_w M_{sx} > H_{kx}.$$

This inequality then yields $$F_w > \frac{H_{kx}}{4\pi T_x M_{sx}},$$

or $$\frac{E_c - (1-e^2)K}{Le^2(1-e^2)^{\frac{1}{2}}} > \frac{H_{kx}}{4\pi T_x M_{sx}}.$$

Since K and $E_c$ do not vary much in value with decreasing values of e, the ratio of the width to the length must be kept sufficiently small such that the $e^2$ factor in the denominator on the left side of the inequality is small enough to make the inequality hold for the choice of thickness of the corresponding ferromagnetic layer material chosen, this material having a particular anisotropy field $H_{kx}$ and a particular saturation magnetization $M_{sx}$.

Aside from its effect on the ratio of width to length in the last equality, there are no significant further limitations on the length of a bit structure 17 beyond practicality limitations. One such limitation is that the need to provide a fairly uniform word line current based magnetic field across a bit structure 17 requires that the word line be approximately as wide as that bit structure. For a desired magnitude of the field generated by the word line current, that current necessary to provide that field magnitude becomes proportional to the width of the word line, that is, equivalently, to the length of the bit structure 17. Thus, there is not only a desire to keep the bit length short to allow as many as possible to be provided in the digital memory to improve its density of storage, there is also a desire to keep the word line currents as small as possible to reduce the heat dissipation in the monolithic integrated circuit which also, as just indicated, requires keeping the bit structure lengths relatively short.

A final limitation on bit structure 17 is related to the required difference in thicknesses between thicker composite ferromagnetic thin-film layer 12,13 and thinner layer 13', 12'. An insufficient difference in thickness between these two layers in the face of high rate of applied magnetic field changes, such as results from the use of an abrupt change in current in the word lines to generate such field changes, can lead to switching the direction of magnetization in both layers concurrently even though just one of them was intended to be switched. That is, if the difference in thickness between the layers, and so the difference in magnetization therebetween, is not sufficiently large, the direction of magnetization in each of these layers will switch together even if the magnitude intended for the switching field is only slightly larger than the switching threshold value of the thinner layer should the change in that field be applied at a high enough rate. Such high rates of application will result from the typical changes in word line current values resulting from transistor switches being switched off and on which often result in the current change approximating a step function.

Since the behavior of the magnetization in the ferromagnetic layers of a bit structure in response to a sharply changing magnetic field is of present concern, the equations of motion for the magnetizations in the ferromagnetic layers in response to changes in magnetic fields are pertinent. Suitable equations of motion are found to relate the time rate of change of the magnetization to the torque applied to that magnetization by all of the magnetic fields present plus some damping of that motion. A well known equation expressing this relationship, based on choosing a certain form of such damping, is the Gilbert equation or $$\frac{d}{dt}\vec{M} = \gamma(\vec{M} \times \vec{H}) - \frac{\alpha}{M_S}\left(\vec{M} \times \frac{d}{dt}\vec{M}\right).$$

Here, the magnetization is shown as a vector, $\vec{M}$, as is the total magnetic field applied to the magnetization, $\vec{H}$. The symbol $\gamma$ is the gyromagnetic ratio, and the symbol $\alpha$ is the damping constant which will be quite small, typically in the range of 0.02 to 0.04.

Expressing this vector equation in its components represented in spherical coordinates results in the following coupled system of first order differential equations (for ferromagnetic thin-films with magnetizations constrained by vertical demagnetizing fields to essentially lie in the plane of the corresponding film) yields $$\frac{d}{dt}\theta = \frac{4\pi M_s |\gamma|}{1+\alpha^2}\phi + \frac{|\gamma|\alpha}{M_s(1+\alpha^2)}\tau,$$

and $$\frac{d}{dt}\phi = \frac{4\pi M_s \alpha |\gamma|}{1+\alpha^2}\phi - \frac{|\gamma|}{M_s(1+\alpha^2)}\tau.$$

Here, $\theta$ is the azimuthal angle (or ferromagnetic layer in-plane angle) and $\phi$ is the polar angle (or ferromagnetic layer out of plane angle) in spherical coordinates. The symbol $\tau$ represents the torque effectively applied as a result of the magnetic fields present.

Figure 6:
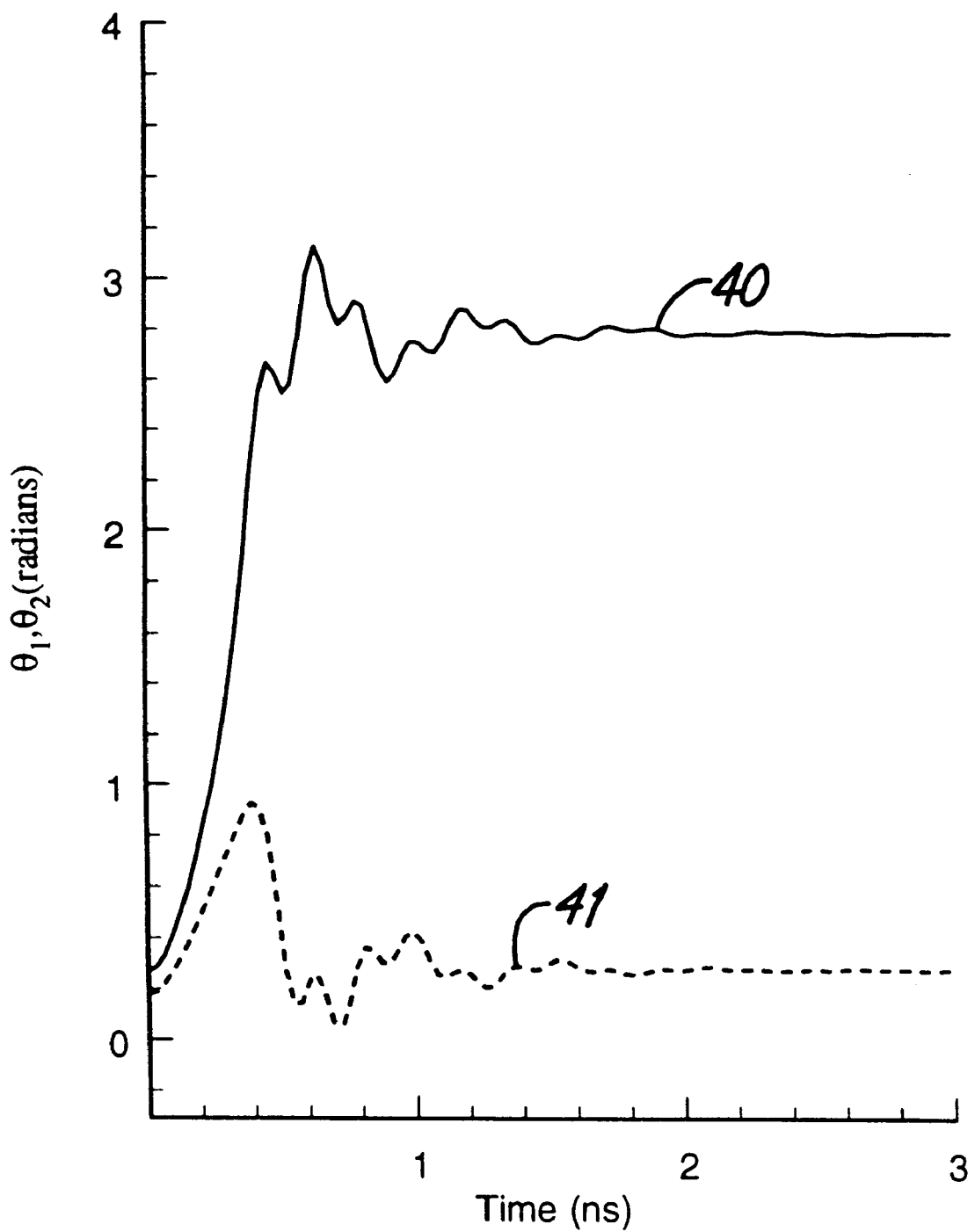
FIG. 6 represents a graph of responses for a structure similar to one of those shown in FIGS. 1A, 1B and 2, FIGS. 7A and 7B show graphs of characteristics for a structure similar to one of those shown in FIGS. 1A, 1B and 2, FIGS. 8A and 8B are a circuit schematic diagram of a portion of a digital memory system based on the structure shown in FIGS. 1A, 1B and 2, and an equivalent circuit of a portion of that circuit schematic diagram.

The response of the magnetizations of the thinner and thicker ferromagnetic thin-films in a bit structure 17 to the dynamic application of torques via the magnetic fields generated by the associated word line currents can be found from these latter equations. FIG. 6 shows a graph of the rotational angular responses of the magnetizations to a word line current generated torque shifting abruptly from zero to a value of about 30 Oe. The lower coercivity thinner layer 13', 12' is represented by an upper plot, 40, on that graph showing how it is more responsive to the applied torque than is the higher coercivity, thicker layer 12,13 represented by the lower plot designated 41. This upper plot is shown with the thinner layer magnetization having rotated in response to an angle from the easy axis of about $\pi$ radians, and so this plot reflects that the direction of the magnetization is switched in that layer due to the application of the word line current generated field.

Notice that there is a substantial oscillation in the angular position of this magnetization vector in reaching its final angular value as seen in plot 40. Although this oscillation, or "ringing", in the response of the magnetization of the thinner ferromagnetic layer to the step function in the word line field is relatively inconsequential to the operation of the device, a similar "ringing" occurs in the rotational angular behavior of the magnetization vector of the thicker layer as seen in plot 41 which can be of much more significance. The largest peak in the "ringing" portion of the lower plot reaches an angular value that is more than twice the angular value of the final angular position taken by the thicker layer magnetization as a result of the applied step function word line current change and the aiding effect of the magnetization angular position change in the thinner layer (up to the point of switching the magnetization direction in that layer).

Although not a problem for the bit structure represented in FIG. 6 because the switching of the magnetization direction in the thinner layer immediately thereafter begins to inhibit the angular positional change of the magnetization of the thicker layer before it reaches $\pi/2$ radians, in some bit structures having too small a difference between the thicknesses of the ferromagnetic thin films or too small a sense current, or both, this initial peak in the "ringing" could reach the $\pi/2$ radian value. At that point, the thicker ferromagnetic layer switches the direction of its magnetization more or less concurrently with the switch in the direction of the magnetization of the thinner layer even though the ultimate final value intended for the angle of rotation of the magnetization of the thicker layer in response to the step function word line current change was less than $\pi/2$ radians. That is, a word line current step function could be applied with the intention of switching the direction of magnetization of the thinner ferromagnetic layer but not that of the thicker layer, but nevertheless result in switching the directions of magnetizations of both layers because of the peak in the "ringing" portion of the response of the magnetization of the thicker layer to the applied field.

Figure 7B:
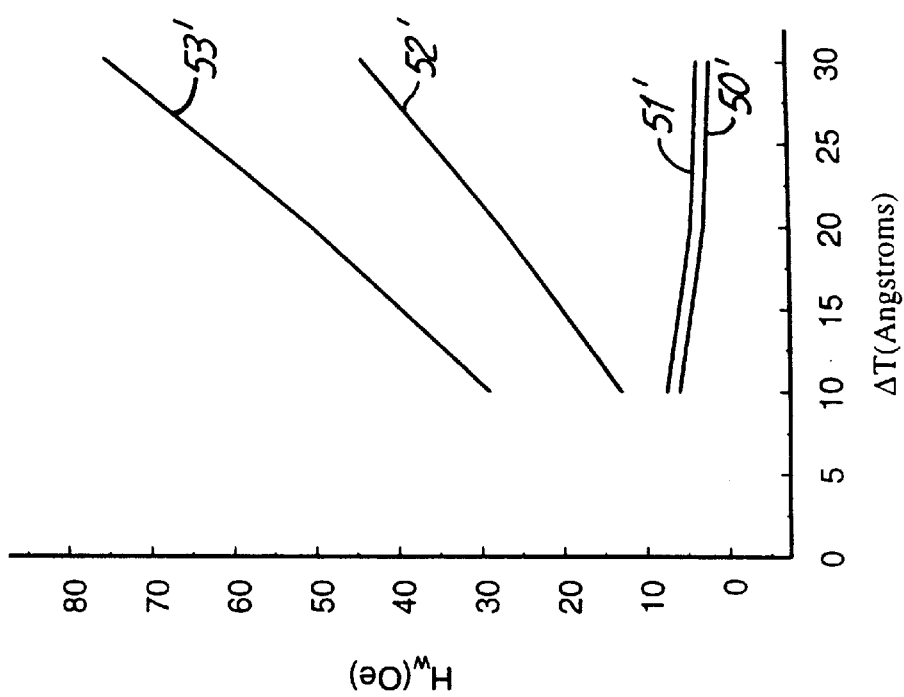
Figure 7A:
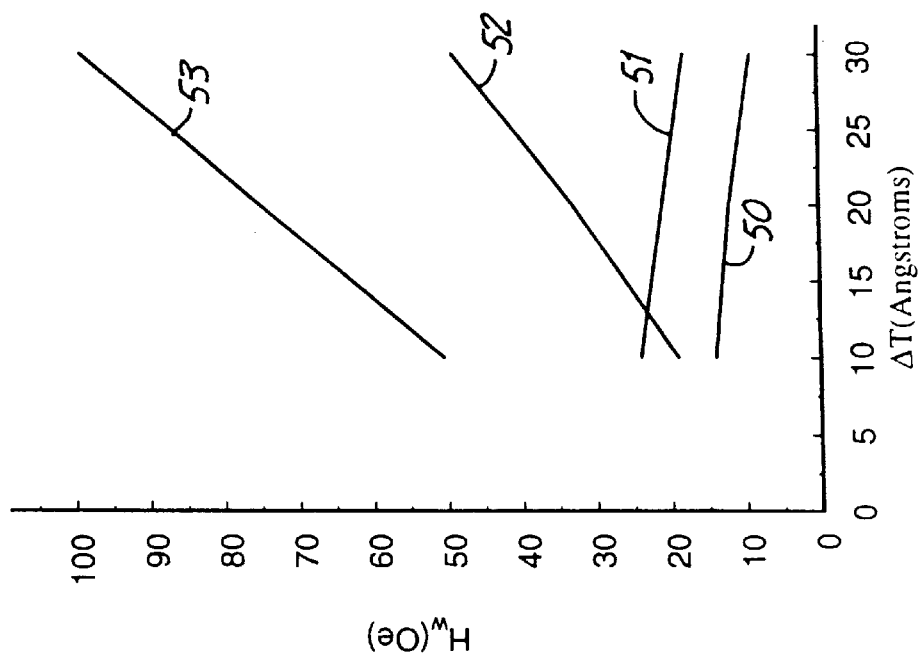

The implications of this dynamic behavior of the rotating magnetizations of the thinner or thicker ferromagnetic thin-films in bit structure 17 can be seen in FIGS. 7A and 7B. In these figures, the dynamic thresholds are plotted as opposed to the quasi-static thresholds which result from minimizing the foregoing energy equations without regard to the dynamic behavior of the structure during operation. The quasi-static thresholds would be from 10% to 15% greater than the dynamic switching thresholds shown in FIGS. 7A and 7B. These switching thresholds are all found on the basis of using the highest rate of change in the effectively applied torque, that is, they are the thresholds which result from a step-function change in the word line current.

The lowest threshold, 50, represents the switching threshold for thinner layer 13', 12' when both the magnetization thereof, and of the thicker layer, have not yet been switched to a direction that is the same as the direction of the applied word line field. The next greater switching threshold, 51, is also for the thinner ferromagnetic thin-film layer, but with the thicker layer having its direction of magnetization matching that of the applied word line field. As can be seen, the magnetization of the thicker layer in this instance has inhibited the rotation of the magnetization of the thinner layer to effectively raise the switching threshold for that thinner layer. In each instance, the thinner layer switching threshold is plotted as a function of the layer thickness difference but that layer has the same thickness of 40 Å for all the plots on this graph.

The next greater switching threshold shown, 52, is the dynamic threshold for thicker layer 12,13 when both this thicker layer and the thinner layer have the magnetizations thereof opposed to the direction of the applied word line field. As a result, there is no inhibiting effect from the magnetization of the thin layer on the magnetization change of the thicker layer so that both switch as a result of the applied field. However, switching threshold 52 is shown as a function of increasing thickness of the thicker layer to thereby result in an increasing thickness difference between the thicker and the thinner layer. Clearly, the switching threshold increases significantly for the thicker layer as the difference of thicknesses in the two layers increases. The final switching characteristic, 53, represents the situation in which the thinner layer is already switched to be directed in the same direction as the applied word line field so as to inhibit the switching of the magnetization of the thicker layer. Again, switching characteristic 53 is plotted as a function of the increasing thickness difference between the layers.

As can be seen, the dynamic switching threshold plots for the thinner layer cross the dynamic switching threshold plots for the thicker layer as the thickness differences between the two layers sufficiently decrease. In this situation, there is clearly a substantial risk of having the directions of magnetization in both the thicker and thinner layer switch together in response to the application of a step function change in the word line current. As the thickness difference between the layers increases, an increasing gap develops between the switching thresholds for the thinner layer and the switching thresholds for the thicker layer thus providing a margin of safety in avoiding the switching of the thicker layer in response to a step-function change in the word line current intended to switch only the direction of the magnetization of the thinner layer.

FIG. 7B shows dynamic switching thresholds of the same nature as those shown in FIG. 7A except they are found in connection with the use of a greater sense current, so in FIG. 7B the threshold designation numerals matching those used in FIG. 7A are followed by a prime mark to result in being designated 51', 52', 53' and 54'. Switching thresholds in FIG. 7B are established on the basis of an initial bias angle $\theta_{S-2}$ which, in effect, provides a field of 25 Oe in opposite directions in each layer, as compared to the bias angle $\theta_{S-1}$ used in finding the switching thresholds shown in FIG. 7A where the effective field due thereto was only 15 Oe. Clearly, the use of a larger magnitude bias angle results in a greater safety margin at lower thickness differences between the thinner layer switching thresholds and the thicker layer switching thresholds.

Thus, the thickness difference between the ferromagnetic thin-films used in a bit structure 17 must be sufficiently great, for the magnitude of the bias angle and the structure geometrical parameters used, to assure that the application of a word line field intended to switch the thinner layer does not also have the effect of an unintended switching of the thicker layer also. In many situations, the thickness difference between the ferromagnetic thin-film layers will need to exceed at least 10% of the average of these two thicknesses.

The energy equations above, based on the ellipsoidal approximations described there for bit structure 17 meeting the foregoing limitations, can be minimized to find the equilibrium angular positions of the ferromagnetic layer magnetizations as a function of the applied bias and word line current generated fields, and to find the quasi-static field thresholds. Necessary conditions for such an energy minimum are $$\tau_2 = \frac{\partial}{\partial \theta_2} E_{Tot} = 0.$$

and $$\tau_1 = \frac{\partial}{\partial \theta_1} E_{Tot} = 0$$

Taking the derivative with respect to $\theta_1$ to find the torque $\tau_1$ and setting the result equal to zero as indicated in the equation for that torque above yields $$\tau_1 = $$

$$H_{k1} M_{s1} \sin(\theta_1 - \theta_2)\cos(\theta_1 - \theta_2) + 4\pi M_{s1}^2 T_1 (F_L - F_w) V_1 \sin(\theta_1)\cos(\theta_1) -$$

$$H_w M_{s1} V_1 \sin(\theta_1) + H_b M_{s1} V_1 \cos(\theta_1) +$$

-continued $$H_e \frac{T_{avg} M_{avg} V_1}{T_1} \sin(\theta_1 + \theta_2) - T_2 4\pi F_w M_{s1} M_{s2} V_1 \cos(\theta_1)\sin(\theta_2) -$$

$$T_2 4\pi F_L M_{s1} M_{s2} V_1 \sin(\theta_1)\cos(\theta_2) = 0$$

using $V_x = AT_x$, with A being the surface area of the ferromagnetic layers, and $V_{avg} = AT_{avg}$ where the parameter $T_{avg}$ is $$T_{avg} = \frac{T_1 + T_2}{2}.$$

Similarly, the derivative with respect $\theta_2$ of the total energy to provide the torque $\tau_2$ and setting it equal to zero as indicated above yields $$\tau_2 = H_{k2} M_{s2} \sin(\theta_2 - \theta_2)\cos(\theta_2 - \theta_2) +$$

$$4\pi M_{s2}^2 T_2 (F_L - F_w) V_2 \sin(\theta_2)\cos(\theta_2) -$$

$$H_w M_{s2} V_2 \sin(\theta_2) - H_b M_{s2} V_2 \cos(\theta_2) +$$

$$H_e M_{s-avg} V_2 \frac{T_{avg}}{T_2} \sin(\theta_1 + \theta_2) -$$

$$T_1 4\pi F_w M_{s1} M_{s2} V_2 \sin(\theta_1)\cos(\theta_2) -$$

$$T_1 4\pi F_L M_{s1} M_{s2} V_2 \cos(\theta_1)\sin(\theta_2)$$

$$= 0$$

A possibility for determining the equilibrium angles and the switching thresholds is to use one of these torque equations to eliminate the dependence in the total energy equation on either one of the magnetization direction rotational angles, and then find the second derivative of the energy and set it to zero to determine the point in which the system is going from a stable equilibrium to an unstable one, i.e. the switching point, yielding $$\frac{d^2 E_{tot}(\theta_x)}{d\theta_x^2} = 0.$$

Alternatively, the two torque equations can be solved self-consistently to obtain the desired solutions. Furthermore, the resistance characteristics for the corresponding bit structure can be plotted versus applied word line current generated field which closely match those shown in FIGS. 3, 4A and 4B using these results and $$R = R_o + \Delta R \sin\left(\frac{\theta_1 - \theta_2}{2}\right).$$

To determine whether such a resistance change has occurred as the result of applying external magnetic fields to a memory cell, memory cells or bit structures 17 will be grouped for purposes of applying operating current thereto for information retrieval operations, and for connecting them to information retrieval output circuitry, to provide efficient use of surface areas in which such cells and such circuitry is provided in the monolithic integrated circuit structure. Thus, a succession of N memory cell or bit structure 17 could be connected in a series string thereof, for instance, and supplied operating current of a magnitude I flowing through that series string to result in a voltage drop thereacross equal to $INR_{min}$ where $R_{min}$ is the minimum resistance of each cell absent applied external magnetic fields or at the extreme values of the external magnetic fields being used. The minimum resistance of each cell will be taken to equal that of all the others for simplicity.

A change in resistance of one selected cell in the series string because of applied external fields of a magnitude sufficient to switch the direction of magnetization of the thinner ferromagnetic layer in that cell will be taken to have a value of $\Delta R$ in reaching its peak resistance value. Such an increase in resistance will result in an output signal of a magnitude equal to $I(NR_{min}+\Delta R-NR_{min})$ or $\Delta RI$ which can be written $IR_{min}\Delta R/R_{min}$ or $IR_{min}r$ where r is the resistive response ratio of an individual cell, i.e. $\Delta R/R_{min}$. In these circumstances, the signal-to-noise ratio of such a series string of memory cells, $s/n|_s$, can be written $$\frac{s}{n}\bigg|_s = \frac{IR_{\min}r}{1.26 \cdot 10^{-6}F(NR_{\min})^{1/2}}$$

using the noise voltage found above for a single cell adapted for N such cells in a series string thereof. This series string of memory cells or bit structures 17 results in a relatively large voltage being developed thereacross, $INR_{min}$, for a significant operating current I therethrough because of the high resistance of the barrier or intermediate layer 14 in each such cell, and the electrical noise in the series string increases with $N^{1/2}$ so that the signal-to-noise ratio decreases by the factor $N^{-\frac{1}{2}}$. Furthermore, the series string will have a relatively high impedance which the information retrieval circuitry will have to match with its input impedance to provide a maximum power transfer.

Monolithic integrated circuits are continually being operated at lower and lower supply voltages, and therefore, may often be more compatible with a parallel interconnection of N memory cells or bit structures 17. Furthermore, limiting the voltage drop across each such cell to 100 mV to obtain the maximum fractional voltage response, as indicated above, is more easily done in a parallel connection of such cells than a series interconnection if there is substantial resistance differences from one cell to another. Furthermore, the interconnection of cells in parallel reduces the effective impedance of the interconnected string which in some situations may be more compatible with the input impedance of the output information retrieval circuitry.

Figure 8A:
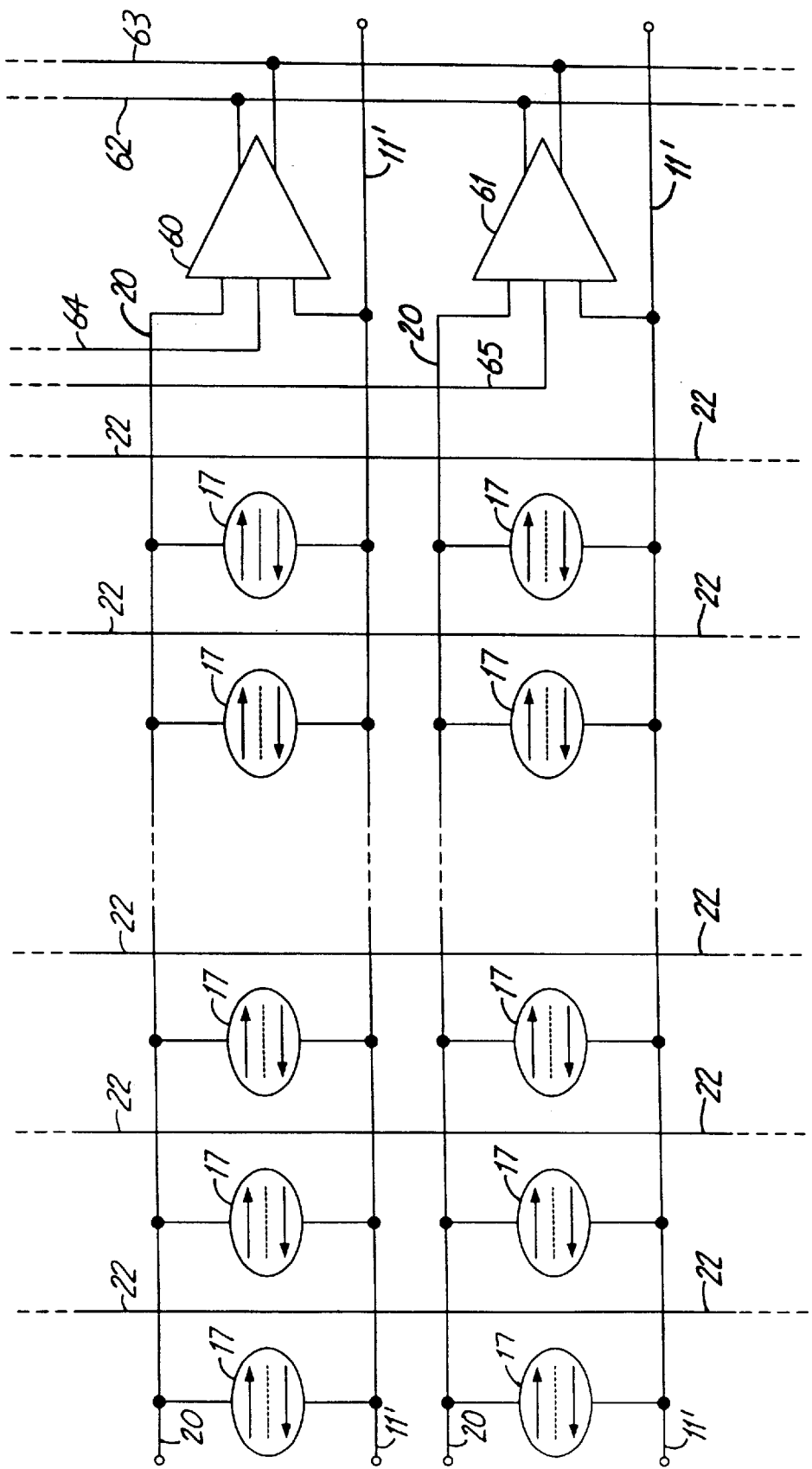

Such a parallel interconnected arrangement is shown in FIG. 8A Here, two sequences of memory cells or bit structures 17 out of an array of many are shown with the cells in each sequence being connected in parallel with one another, an upper sequence which is connected to a first output information retrieval circuit sensing amplifier, 60, and a lower sequence of parallelly interconnected cells is connected to a further information retrieval output circuit sensing amplifier, 61. The two outputs of each of sensing amplifiers 60 and 61 provide complementary logic signals on a pair of data output lines, 62 and 63. Sensing amplifier 60 is enabled by a first enable line, 64, and sensing amplifier 61 is enabled by a second enable line, 65.

Each of memory cells or bit structures 17 in the upper sequence thereof has a word line 22 passing by it, and each is connected between upper interconnection 20 and interconnection and support 11'. In switching circuitry not seen, interconnection and support 11' and interconnection 20 can be connected to carry an operating current I of which a fraction is provided to each cell 17 connected therebetween during information retrieval processes while their corresponding sensing amplifier is enabled, and while the word line adjacent the cell selected for retrieval has current directed therethrough sufficient to switch the magnetization direction of thinner ferromagnetic layer 12', 13' therein. For information storage processes, interconnection and support 11' and the corresponding one of word lines 22 can be switched to both have substantial currents passed therethrough that together are sufficient to provide a magnetic field to switch the direction of magnetization of thicker layer 12, 13 in the corresponding one of cells 17.

Figure 8B:
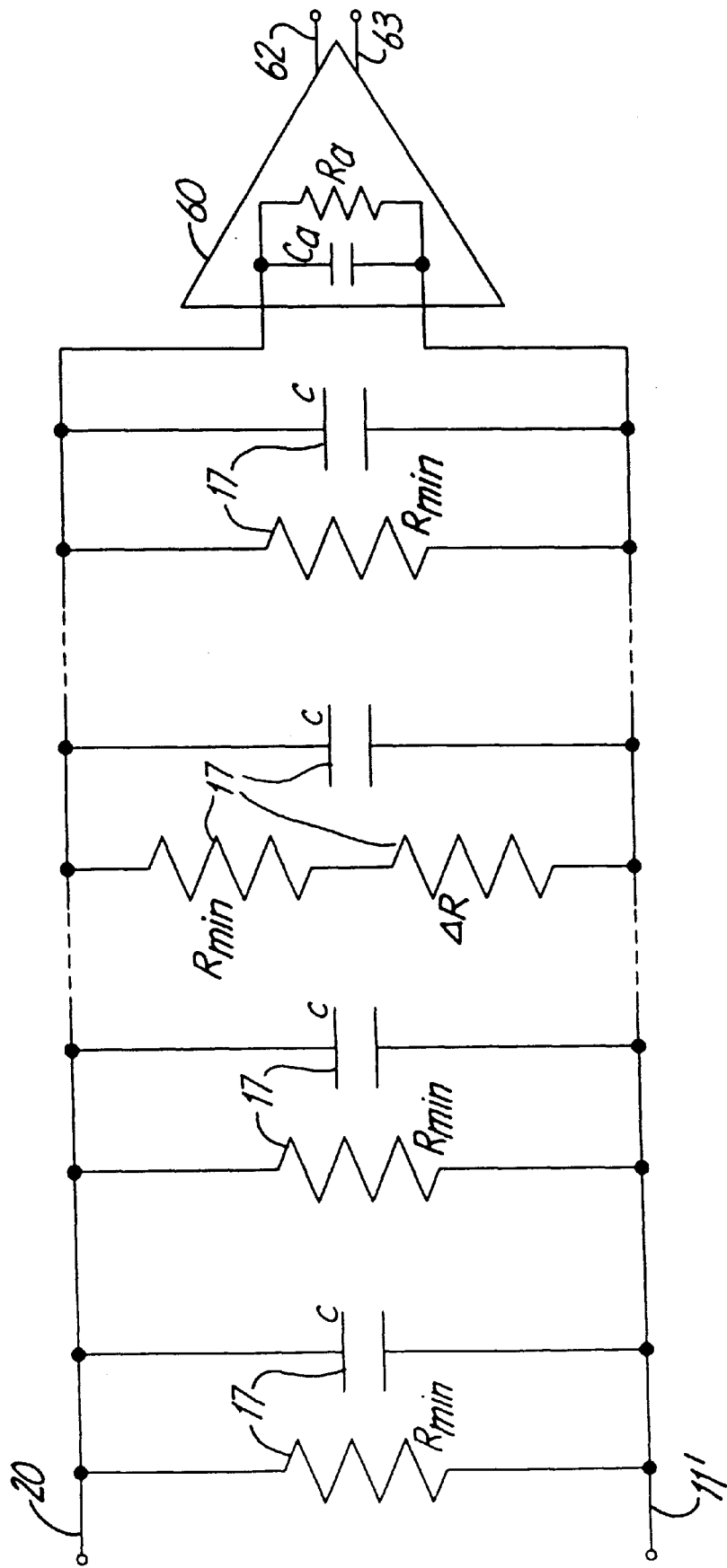

FIG. 8B shows a basic equivalent circuit for one of the interconnected parallel sequences of memory or bit structures 17 depicted in FIG. 8A, the upper sequence being chosen for illustration in FIG. 8B. Each of cells 17 is represented by a resistance having a value of $R_{min}$ and a capacitance having a value of C. One of the cells 17, in addition to being represented as having a resistance of $R_{min}$, has had its magnetic state changed so as to be further represented as exhibiting an additional resistance of value $\Delta R$ above its minimum value of $R_{min}$. Again for simplicity, all cells are represented as having the same resistance and capacitance values except for the one exhibiting the added resistance value of $\Delta R$. Sense amplifier 60 is shown having an internal impedance represented by a resistor with a value of resistance $R_a$ and a capacitance having a capacitance value of $C_a$. In this circuit arrangement for interconnecting a group of cells 17 to one another and the information retrieval output circuitry, the effective resistance-capacitance time constant would be with $R_a=1/G_a$ $$\frac{NC+C_a}{NG_{\max}+G_a},$$

which, for small $C_a$ and maximum energy transfer so that Ra=Rmin/N, again becomes $$\frac{NC}{NG_{\max}+NG_{\max}} = \frac{C}{2G_{\max}}.$$

The resistance of N parallel resistances of value $R_{min}$ is equal to $R_{min}/N$. The resistance value of (N−1) resistors of value $R_{min}$ in parallel with each other and in parallel with a further resistance of value $R_{min}+\Delta R$ is $$\frac{R_{\min}^2 + R_{\min}\Delta R}{NR_{\min}+(N-1)\Delta R}.$$

As a result, the output signal of the sequence of memory cells 17 connected in parallel when one of them has an increase in resistance of $\Delta R$ is $$I\left[\frac{R_{\min}^2 + R_{\min}\Delta R}{NR_{\min}+(N-1)\Delta R} - \frac{R_{\min}}{N}\right].$$

This can instead be written as $$\frac{IR_{\min}}{N}\frac{\frac{\Delta R}{R_{\min}}}{N+(N-1)\frac{\Delta R}{R_{\min}}} = \frac{IR_{\min}}{N}\frac{r}{N+(N-1)r}$$

where r is again the response ratio $\Delta R/R_{min}$.

If a voltage $V_0$ of approximately 100 mV is to be nominally maintained across each of memory cell 17 in the parallelly interconnected sequence thereof to keep them at their maximum output signal sensitivity, as indicated above, the nominal voltage drop $IR_{min}/N$ across that interconnected array can be written as $V_o$ to give $$V_o \frac{\frac{\Delta R}{R_{min}}}{N + (N-1)\frac{\Delta R}{R_{min}}} = V_o \frac{r}{N + (N-1)r}.$$

Thus, the output signal of the array of parallel interconnected memory cells decreases as the number of memory cells increases, that is, the magnetoresistive response ratio r of an individual memory cell effectively is decreased as the number of memory cells in parallel increases giving an output signal that decreases from around 20 mV for an individual cell to around 2 mV if 10 such cells are connected together in parallel.

The signal-to-noise ratio of the array of parallel interconnected memory cells becomes $$\frac{s}{n}\bigg|_P = \frac{V_0 \frac{r}{N + (N-1)r}}{1.26 \cdot 10^{-6} F \left(\frac{R_{min}}{N}\right)^{1/2}}.$$

As can be seen, the electrical noise is reduced in the array of parallel interconnected memory cells by a factor of $(1/N)^{1/2}$ due to the memory cells being connected in parallel which leads to a reduced effective resistance for the sequence as the source of electrical noise therein. This reduced noise, of course, is countered by the reduced value of the output signal so that the signal-to-noise ratio also decreases by the factor $(N)^{1/2}$ (actually, a bit more than that depending on the value of the response ratio).

Such circumstances will, in many instances, require finding some other kind of circuit arrangement in which to interconnect a group of memory cells or bit structures 17 with information retrieval output circuitry which does not lead to reducing the signal at the output from a single cell 17 of around 20 mV to some effectively much smaller signal value in the presence of a group of interconnected cells dependent on the number of cells so interconnected. One way of preserving this output signal value of around 20 mV from each memory cell or bit structure 17 in an array thereof to the information retrieval output circuitry is shown in FIG. 9A. There, n-channel enhancement mode metal-oxide-semiconductor field-effect transistors (MOSFET's), 70, are provided in and on semiconductor substrate 10 each in series with a corresponding one of memory cells or bit structures 17. In such an arrangement, these transistors are able to, when in the "off" condition, substantially electrically isolate the corresponding one of those cells from the corresponding conductor leading therefrom to the information retrieval output circuitry, and so from the other cells in the group or array.

Each of transistors 70 has its source, 71, electrically connected through an interconnection, 72, to a corresponding one of cells 17. Each of transistors 70 has its drain, 73, electrically connected to a conductor, 74, which in turn is electrically connected to allow the switching thereof to an electrical energization source, not shown, which supplies operating current to any selected one of cells 17 connected through its corresponding transistor 70 thereto. Conductor 74 is also connected to a selection MOSFET, 75, serving as a pass transistor which in turn is connected to sensing amplifier 60. Each of selection transistors 75 is switched into the "on" condition by a corresponding signal on the corresponding one of the gate selection interconnections, 76, connected to its gate.

The opposite side of each of cell 17 is electrically connected through an interconnection, 77, to a further conductor, 78, which in turn is electrically connected to allow the switching thereof to an electrical energization source, not shown, which either draws operating current from any selected one of cells 17 connected thereto, or supplies a magnetic field generating current for aiding in the switching of the magnetization direction of a ferromagnetic layer or layers in a cell 17. In the latter instance, the magnetic field generated by a current in conductor 77 can aid the magnetic field generated by current in a word line 22 passing near one of cells 17 of interest to have either or both magnetic fields available for information retrieval or information storage purposes. Transistors 70 are switched between the "on" condition and the "off" condition by selection signals applied to their gates, 79, over corresponding conductors, 80.

Transistors 70 can alternatively each be interchanged in position with its corresponding cell 17 in the series connection thereof between a conductor 74 and a conductor 78 to place that cell in the transistor drain circuit rather than its source circuit without significant effect on the electrical isolation of the cell from other cells. Also, bipolar transistors could alternatively be used for transistors 70 rather than the MOSFET's shown. Of course, the implementing structures in monolithic integrated circuits for these alternatives would require substantial changes from that used with the MOSFET devices shown.

Coincident currents are used for selecting a cell 17 as the basis for retrieving information therefrom or for storing information therein. To retrieve information from a cell 17, a signal is provided over conductor 80 to gate 79 of the transistor to which that cell is connected to switch that transistor into the "on" condition, and an electrical energization source is switched onto conductor 74 to provide operating current through the transistor and the corresponding selected cell which is carried away on conductor 78. A current in the corresponding one of word lines 22 for that cell is generated sufficient to switch the magnetization of the thinner one of the ferromagnetic layers in the cell as part of the retrieval operation process. The switching on of transistor 70 allows a resistance shift in cell 17 to cause an increased voltage drop thereacross which is sensed through that transistor 70 on line 74 by sensing amplifier 60 which receives that signal through the corresponding one of selection transistor 75 selected by a signal on the corresponding one of selection line 76.

An information storage operation, on the other hand, requires coincident currents being switched onto conductor 78 and word line 22 which together provide a sufficiently large magnetic field to switch the magnetization direction of the thicker one of the ferromagnetic layers in the selected one of cells 17 at which the currents are coincidentally presented. Transistors 70 are switched into the "off" condition during such storage operations.

Figure 9B:
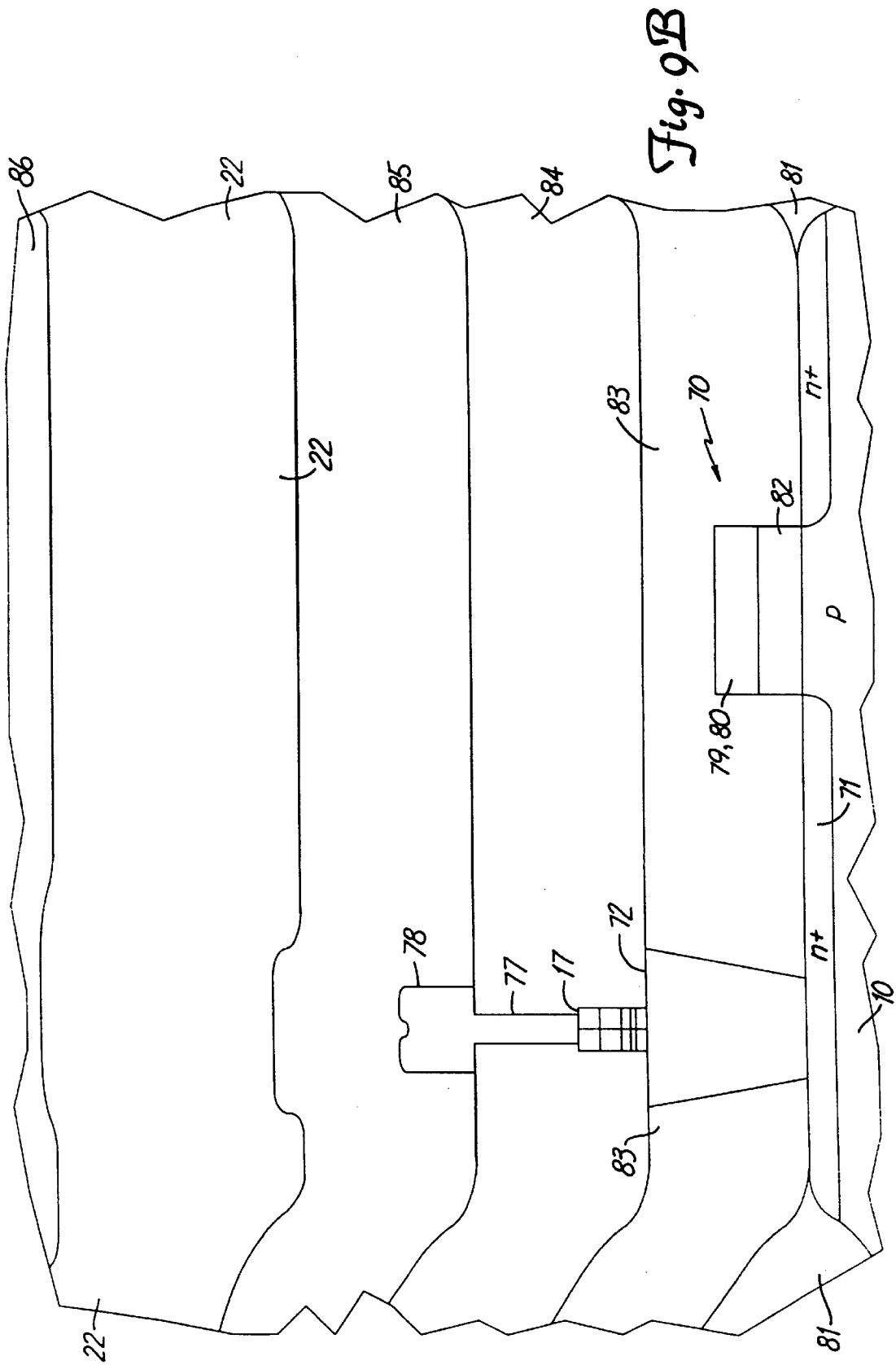

One possible construction for a portion of a monolithic integrated circuit chip to provide the circuit arrangement shown in FIG. 9A is indicated in the layer diagram for one of cells 17 and the associated transistor 70 shown in FIG. 9B. There, semiconductor material substrate 10 of p-type conductivity has transistor 70 formed in and on a portion of a major surface thereof which is made available by providing an opening in a device isolating field oxide, 81. Drain 73 and interconnection 74 are formed by an implanted $n^+$-type conductivity region in semiconductor substrate 10, and separated from a similar n+-type conductivity implanted region forming source 71 by doped polysilicon gate 79 extending to doped polysilicon conductor 80 not seen in this figure. Gate 79 is separated from semiconductor substrate 10 by a thin gate oxide, 82. Transistor 70 as described is formed by well known techniques for the fabrication of such transistors in monolithic integrated circuits.

A further insulating oxide layer, 83, has been provided over transistor 70, and an opening has been provided therein over source 71 in and over which a first metal deposition is provided. This result is and subjected to a planarization process to leave a metal plug of aluminum alloyed with 2% copper as interconnection 72 extending through oxide layer 83 from source 71 to the upper surface of this oxide layer. On this metal plug, or interconnection, 72 is formed a memory cell or bit structure 17, in the manner described above. Using well known techniques following such a provision, a layer of silicon nitride, 84, has been deposited and then patterned to provide a opening therein to memory cell 17 in which a second metal deposition and patterning has been provided to form interconnection 77 and conductor 78, again an aluminum alloy with 2% copper. Another layer of silicon nitride, 85, is then deposited as a base for the subsequent deposition of a metal layer to form word line 22, again of aluminum alloyed with 2% copper. Finally, a passivating and protective layer of silicon nitride, 86, is deposited.

Figure 10A:
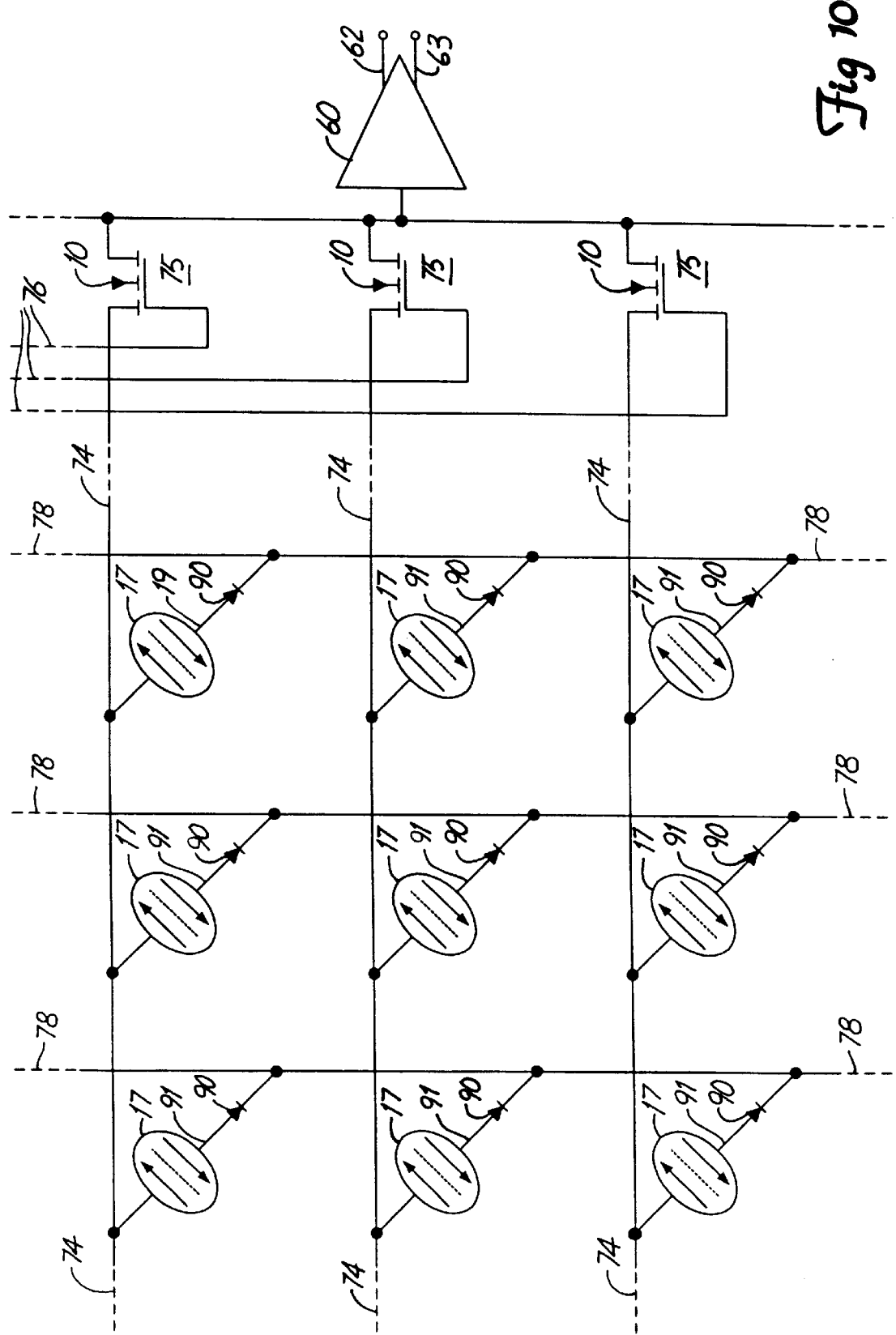

In an alternative cross-point interconnection arrangement for information retrieval output circuitry interconnecting groups of cells 17, coincident currents are again used in both information retrieval operations undertaken to retrieve information from those cells, and in information storage operations used in connection with such cells. Such a circuit arrangement is shown in FIG. 10A where conductors 74 are now connected directly to one side of the succession of memory cells or bit structures 17, and are connectable to an electrical energization source at one end thereof to provide either operating currents or a magnetic field generating current for those cells connected thereto. In addition, conductors 74 are also connected to a corresponding one of pass transistors 75 as in FIG. 9A which can each be switched into the "on" condition by signals provided on the corresponding selection line 76 connected to its gate to thereby provide a conductive path from the corresponding conductor 74 to sensing amplifier 60. Conductors 78 are this time shown extending in a direction substantially perpendicular to conductor 74, and they can carry away operating current from a selected cell 17 electrically connected thereto or can carry current to generate a magnetic field thereabout which will affect those cells 17 electrically connected thereto.

If cells 17 were each directly connected to a corresponding conductor 78, so as to each be directly connected between a corresponding one of conductors 74 and a corresponding one of conductors 78, the connecting of an electrical energization source to a selected conductor 74 and a selected conductor 78 would lead to current in other current paths through the array beyond the current path through the cell 17 connected between these two selected conductors. Current in such other current paths can lead to undesirable effects with respect to the output signal from the intended selected cell directly connected between the selected conductors. Such unwanted effects can again be alleviated by providing sufficient electrical isolation of each cell 17 from the other cells present in the array so that substantially the full 20 mV output signal available from the selected cell will reach sensing amplifier 60 through the corresponding enabled one of transistors 75.

One way this can be accomplished is shown in FIG. 10A by connecting a diode, 90, between each cell 17 and its connection to a corresponding conductor 78 with the diode anode connected through an interconnection, 91, to cell 17. This prevents any conductive path portions extending from conductors 78 through corresponding cells 17 to the corresponding conductors 74. Alternatively, the positions of each of diodes 90 and its corresponding cell can be interchanged in the series connection between a conductor 74 and a conductor 78 without significant effect on the electrical isolation of a cell from the other cells in the interconnected group, although a different structural implementation would be used in a monolithic integrated circuit. Thus, in this alternative, the cathode of the diode would be connected to its corresponding one of cells 17.

Figure 10B:
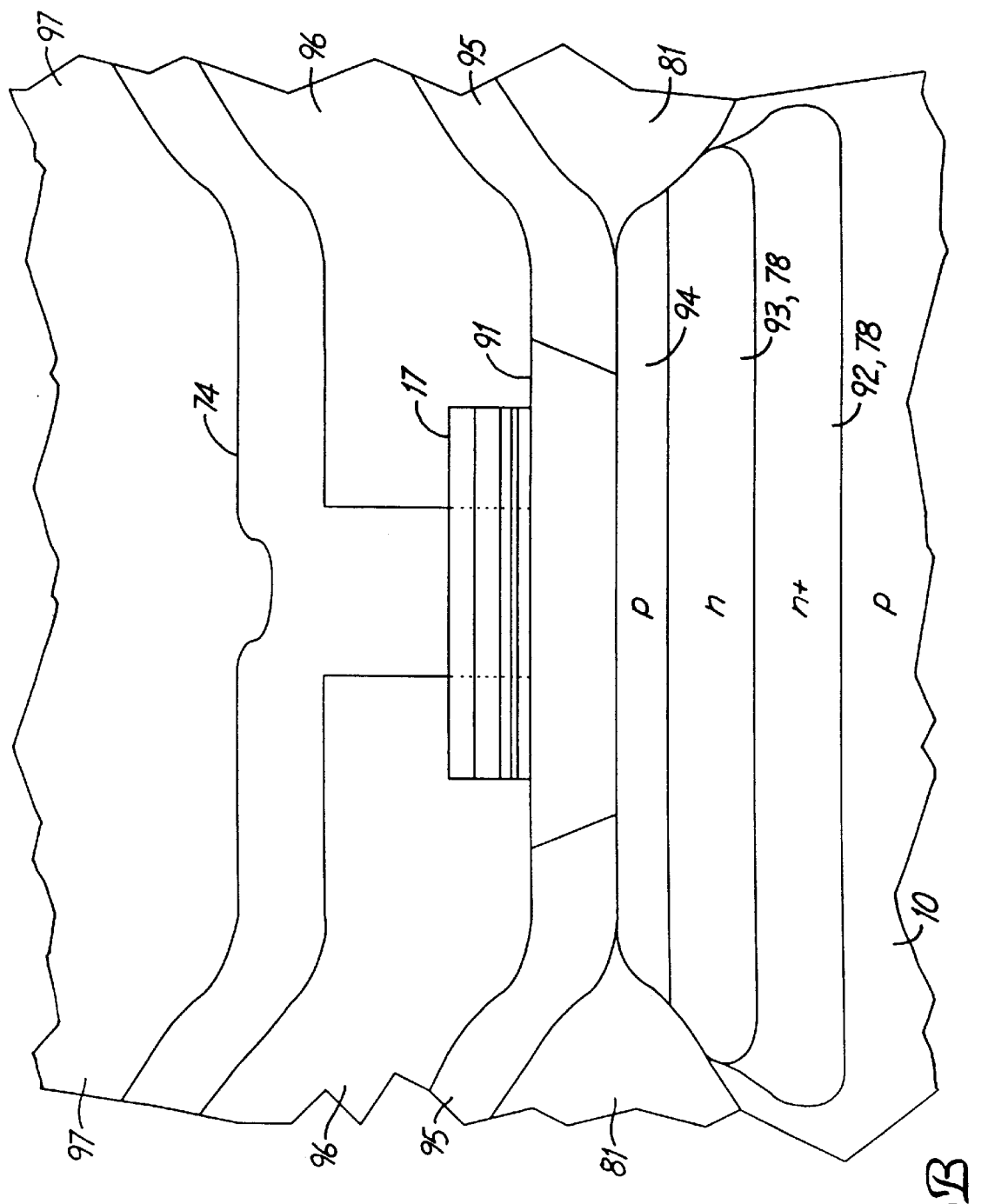

FIG. 10B shows a portion of a layer diagram of one of cells 17 and the corresponding diode of FIG. 10A formed in a well known manner along with the interconnections 74 and 78 extending substantially perpendicular to one another also formed by known techniques. Semiconductor substrate 10 of p-conductivity first has a n+-type conductivity region, 92, implanted therein in an opening in field oxide 81 to prevent any transistor action occurring between substrate 10 and the regions to be subsequently provided in that substrate above region 92. This region is designated 92, 78 because it will also form part of conductor 78. Thereafter, a further n-type conductivity region, 93, is implanted through that same opening in oxide 81 over and into region 92 to complete the diode cathode and also again form part of conductor 78. This is followed by implanting a p-type conductivity region, 94, through the same oxide opening over and into region 93 to form the diode anode. An oxide layer, 95, is then provided over this field oxide opening, oxide layer 81 and region 94, and an opening is thereafter provided in oxide layer 95 to provide an access opening to region 94. A first metal layer of aluminum alloyed with 2% copper is then deposited and patterned to fill this opening to provide a metal plug, or interconnection, 91, with the result subjected to a planarization process. A memory cell or bit structure 17 is then formed on metal plug 91 in the manner described above.

Thereafter, using known techniques, a silicon nitride layer, 96, is deposited over the exposed surfaces of metal plug 91, oxide layer 95 and cell 17. An opening is provided in silicon nitride layer 96 to reach cell 17 and metal is deposited in a second metal deposition step, again aluminum alloyed with 2% copper, to provide conductor 74 after patterning. A further passivating and protective silicon nitride layer, 97, is then provided.

Small memories which are embedded in other circuitry being used therewith often require larger output signals than are provided by memory cells or bit structures 17 directly. Such cells can be incorporated in a flip-flop arrangement to provide the current steering necessary to place the flip-flop in a selected state. Two such flip-flop circuits are shown in FIGS. 11A and 11B.

Figure 11A:
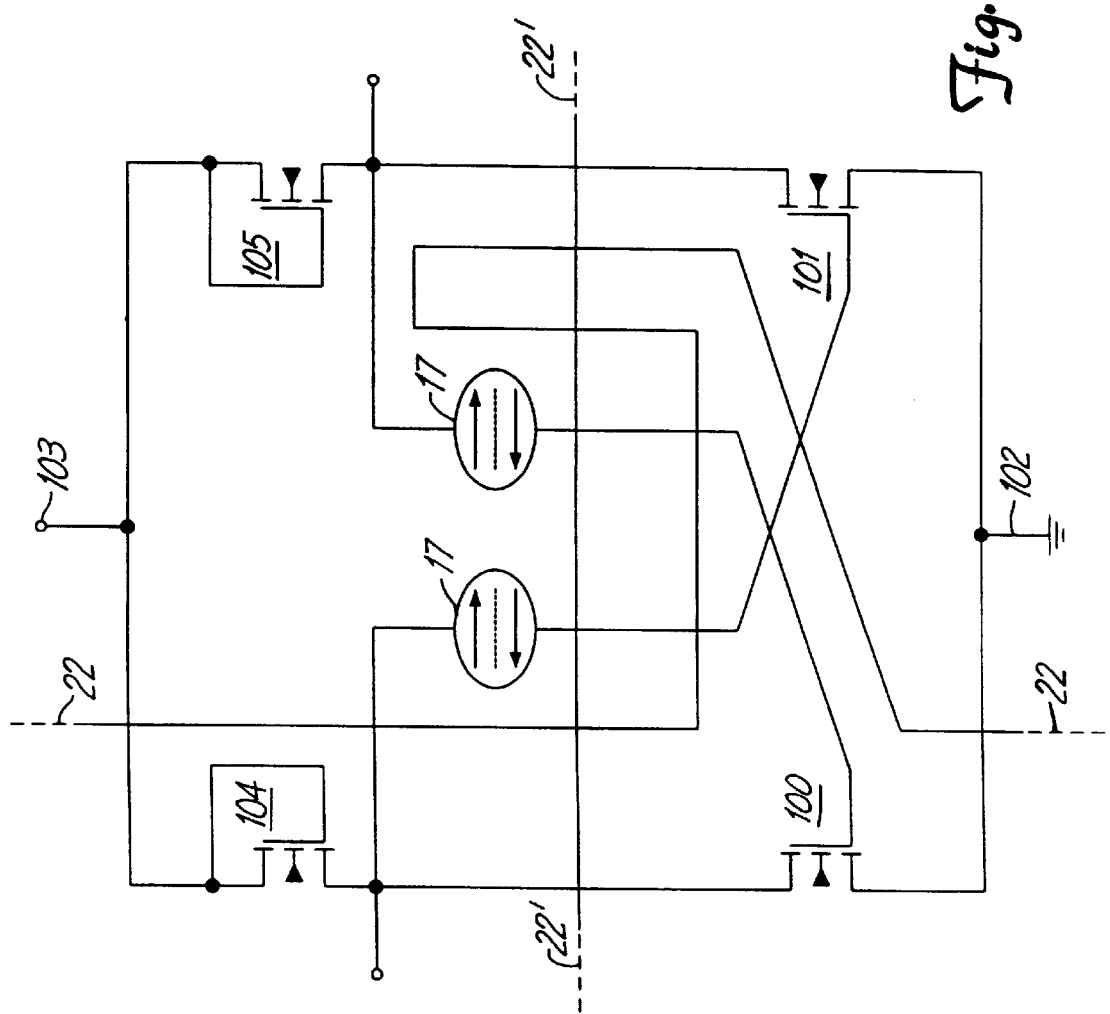
FIGS. 11A, 11B and 11C are circuit schematic diagrams of a portion of alternative digital memory systems based on the structure shown in FIGS. 1A, 1B and 2.
Figure 11B:
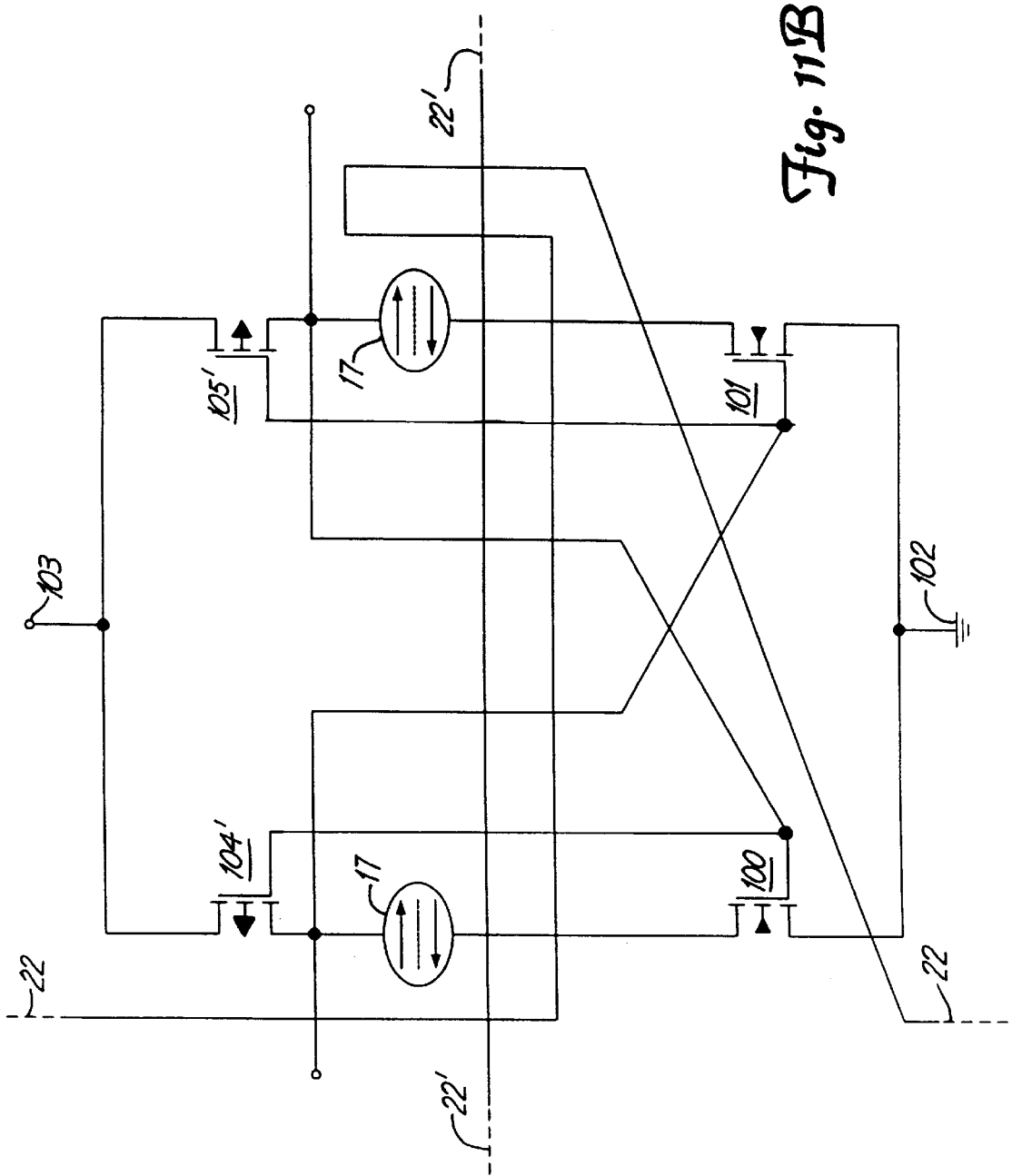

FIG. 11A shows a pair of n-channel enhancement mode MOSFET's, 100 and 101, each having its source electrically connected to a ground reference potential terminal, 102, provided in conjunction with a positive voltage power supply terminal, 103, suited for connection to a source of positive voltage. Each of transistors 100 and 101 has its drain connected to the source of a corresponding one of a pair of n-channel enhancement mode MOSFET's, 104 and 105, serving as loads in the drain circuits of the corresponding ones of transistors 100 and 101. Load transistors 104 and 105 each has its gate connected to its drain. These drains in turn are connected to positive supply voltage terminal 103.

The side of the circuit of FIG. 11A having transistors 100 and 104 connected in series with one another, and the side of that circuit having transistors 101 and 105 connected in series with one another, are cross-coupled to one another through use of two memory cells or bit structures 17. Each of cells 17 has one side thereof connected to a corresponding one of the drains of transistors 100 and 101, and has the other side thereof connected to the gate of the opposite one of those transistors. In addition, a word line 22 extends past each of cells 17 but carries the current therethrough in opposite directions by each of those cells so as to be able to switch the magnetization directions in the ferromagnetic layers of each cell in a direction opposite to that of the other. A further word line, 22', is also provided past of each of cells 17 so that cells 17 can be selected for magnetization direction changes of the thicker ferromagnetic layer therein through the use of coincident currents in word lines 22 and 22'.

Since of each cells 17 are in the opposite storage state in having the magnetizations of the thicker layers therein pointing in opposite directions with respect to fields generated by currents in word line 22', a switching of voltage from the ground potential to a substantial positive level on positive voltage supply terminal 103 coincident with current through word line 22' will result in one of cells 17 being in the minimum resistance condition and the other in the maximum resistance condition. As a result, a greater current will pass through the cell with the smaller resistance into the parasitic capacitance extending to ground from the gate of the corresponding one of transistors 100 and 101 to which it is connected. This parasitic gate capacitance will thus gain charge more rapidly to thereby switch that transistor to the "on" condition, and so prevent the opposite one of those transistors from switching into that condition because of the decrease in the drain voltage of the "on" transistor to a value below the threshold voltage of the opposite transistor having its gate connected to this drain as this "on" transistor draws current through its load. The two different voltage levels at the drains of transistors 100 and 101 after such a switching of sufficient positive voltage onto terminal 103 represent the digital information and its complement stored in the thicker ferromagnetic layers of the cells 17.

The flip-flop will maintain this condition for the positive voltage on terminal 103 being maintained even after current is removed from word line 22' since the voltage at the drain of that one of transistors 100 and 101 which is switched into the "on" condition will continue to be of a value less than the threshold voltage of the other. This output result of switching from ground potential to a sufficient positive voltage on terminal 103 along with the coincidental provision of current in word line 22' can be changed for the next such switching only by having previously coincidentally provided word line currents through word line 22' and word line 22 to thereby have switched the magnetizations of the thicker one of the ferromagnetic layers in each of cells 17.

A similar operation is achieved in the complementary metal-oxide-semiconductor field-effect transistor (CMOS) circuit of FIG. 11B when the voltage on positive supply voltage terminal 103 is increased from ground potential to a sufficient positive potential, but the dependence on the parasitic capacitance of the gates of transistors 100 and 101 is not as significant because of the changed configuration. Transistors 104 and 105 in FIG. 11A are replaced with a pair of p-channel enhancement mode transistors, 104' and 105', in FIG. 11B with the gates thereof electrically connected to the corresponding gates of transistors 100 and 101, respectively. The gates of transistors 100 and 104' are cross-coupled to the other side of the circuit through being directly connected to the drain of transistor 105', and the gates of transistors 101 and 105' are similarly cross-coupled by being directly connected to the drain of transistor 104'. Cells 17 are each connected between the source of one of transistors 104' and 105' and the drain of the corresponding one of transistors 100 and 101.

Thus, as positive voltage is switched onto positive supply terminal 103 with a coincident current flowing in word line 22', the one of cells 17 having the larger resistance will lead to a greater voltage drop across it and the corresponding one of transistors 100 and 101 to the drain of which it is connected so as to switch into the "on" condition first the opposite one of those transistors. A temporary current will flow through this "on" condition transistor, the cell 17 connected to its drain and the p-channel transistor connected to that cell with this latter transistor than switching into the "off" condition. This will leave the other p-channel transistor in the "on" condition and the n-channel transistor in series therewith and the other cell 17 in the "off" condition. Again, this output result of switching from ground potential to a sufficient positive voltage on terminal 103 along with the coincidental provision of current in word line 22' can be changed for the next such switching only by having previously coincidentally provided word line currents through word line 22' and word line 22 to thereby have switched the magnetizations of the thicker one of the ferromagnetic layers in each of cells 17.

Figure 11C:
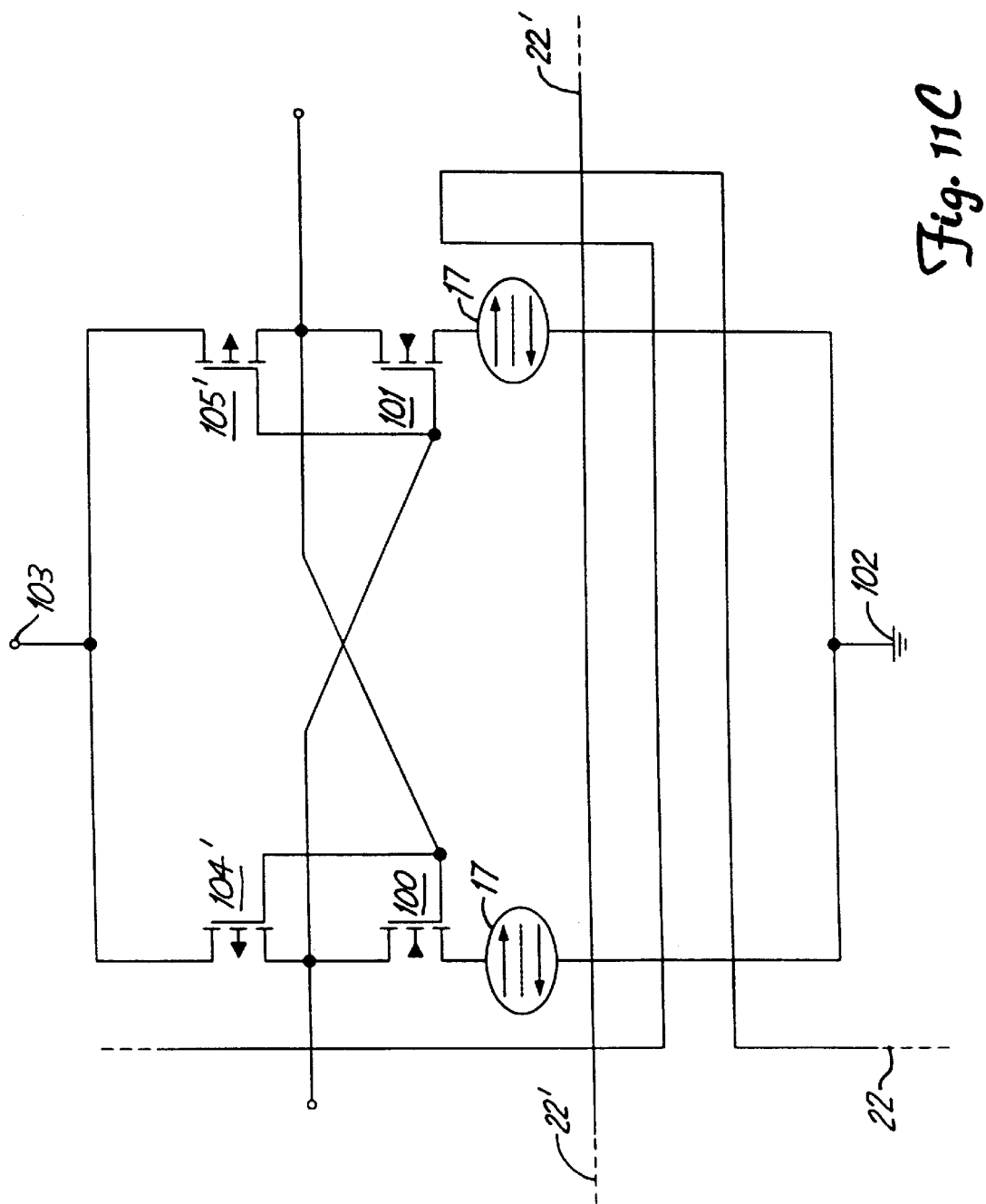

The circuit shown in FIG. 11C has the cells 17 repositioned from the drain circuits of transistors 100 and 101, as shown in FIG. 11B, to the source circuits of those transistors to each be connected between a corresponding one of those sources and ground. Much the same operation will occur for this circuit as the for the circuit in FIG. 11B except that the one of cells 17 having the larger resistance leading to a greater voltage drop across it will prevent the one of transistors 100 and 101 connected thereto from switching into the "on" condition first resulting in the other of those transistors doing so.

Although the present invention has been described with reference to preferred embodiments, workers skilled in the art will recognize that changes may be made in form and detail without departing from the spirit and scope of the invention.

We claim:

1. A ferromagnetic thin-film based digital memory circuit, said circuit comprising:

a pair of switching devices, each having first and second terminating regions and a control region by which that said switching device is capable of being directed to provide a conductive path between that said switching device first and second terminating regions of a selected conductivity;

a pair of load devices each capable of conducting current therethrough to result in a voltage drop thereacross and each electrically connected in series with said second terminating region of a corresponding one of said plurality of switching devices and interconnection means suited for electrical connection to a source of electrical energization, said pair of load devices each also being coupled to a control region of that one of said pair of switching devices opposite that with which it is electrically connected in series; and a pair of bit structures each coupled to a corresponding one of said pair of load devices so as to result in different value voltages at said control regions of said pair of switching devices for selected increases in voltage magnitude on said interconnection means, said bit structures comprising:
  a nonmagnetic intermediate layer, said intermediate layer having two major surfaces on opposite sides thereof such; and
  a memory film of an anisotropic ferromagnetic material on each of said intermediate layer major surfaces having switching thresholds for magnetizations of said film adjacent each of said intermediate layer major surfaces that differ in value for a switching of these magnetizations from both being directed initially at least in part in substantially a common direction to being directed at least in part in substantially opposite directions versus a switching from being directed initially at least in part in substantially opposite directions to both being directed at least in part in substantially a common direction, and
a pair of word line structures each having a pair of word line end terminal regions adapted to conduct electrical current in at least one direction therethrough, each of said pairs of word line end terminal regions having an electrical conductor electrically connected therebetween which is located across an electrical insulating layer from said memory film on one of said major surfaces of said intermediate layer of a corresponding one of said bit structures.

2. The apparatus of claim 1 wherein said pair of bit structures each is electrically connected between one of said pair of load devices and a said control region of one of said switching devices.

3. The apparatus of claim 1 wherein said pair of bit structures each is electrically connected between one of said pair of load devices and a said second terminating region of one of said switching devices.

4. The apparatus of claim 1 wherein a said bit structure has a length along a selected direction and a width substantially perpendicular thereto that is smaller in extent than said length, said memory film in a said bit structure being characterized by an anisotropy field, and said width being sufficiently small that demagnetization fields arising in said memory film in response to its saturation magnetization being oriented along that said width exceed in magnitude said anisotropy field.

5. The apparatus of claim 1 wherein a said bit structure has a length along a selected direction and a width substantially perpendicular thereto that is smaller in extent than said length and has a shaped end portion extending over a portion of said length in which said width gradually reduces to zero at an end thereof.

6. The apparatus of claim 1 wherein said memory film at each of said major surfaces of said intermediate layer of at least one of said bit structures is arranged such that there are two separate films with one of said separate films on each of said major surfaces, and said intermediate is also of an electrical insulating kind of material.

7. The apparatus of claim 6 wherein said bit structure has a length along selected direction and a width substantially perpendicular thereto that is smaller in extent than said length, said width being less than about two curling lengths of said separate films from edges thereof substantially perpendicular to said width.

8. The apparatus of claim 6 wherein said memory film at each of said major surfaces is a composite film having a thinner stratum of higher magnetic saturation induction adjacent said intermediate material and a thicker stratum of lower magnetic saturation induction.

9. A ferromagnetic thin-film based digital memory circuit, said circuit comprising:
  a pair of switching devices, each having first and second terminating regions and a control region by which that said switching device is capable of being directed to provide a conductive path between that said switching device first and second terminating regions of a selected conductivity;
  a pair of load devices each capable of conducting current therethrough to result in a voltage drop thereacross and each electrically connected in series with said second terminating region of a corresponding one of said plurality of switching devices and interconnection means suited for electrical connection to a source of electrical energization, said pair of load means each also being coupled to a control region of that one of said pair of switching devices opposite that with which it is electrically connected in series; and
  a pair of bit structures each electrically connected in series with said second terminating region of a corresponding one of said plurality of switching devices so as to result in different value voltages at said control regions of said pair of switching devices for selected increases in voltage magnitude on said interconnection devices, said bit structures comprising:
    a nonmagnetic intermediate layer, said intermediate layer having two major surfaces on opposite sides thereof; and
    a memory film of an anisotropic ferromagnetic material on each of said intermediate layer major surfaces having switching thresholds for magnetizations of said film adjacent each of said intermediate layer major surfaces that differ in value for a switching of these magnetizations from both being directed initially at least in part in substantially a common direction to being directed at least in part in substantially opposite directions versus a switching from being directed initially at least in part in substantially opposite directions to both being directed at least in part in substantially a common direction, and
  a pair of word line structures each having a pair of word line end terminal regions adapted to conduct electrical current in at least one direction therethrough, each of said pairs of word line end terminal regions having an electrical conductor electrically connected therebetween which is located across an electrical insulating layer from said memory film on one of said major surfaces of said intermediate layer of a corresponding one of said bit structures.

10. The apparatus of claim 9 wherein a said bit structure has a length along a selected direction and a width substantially perpendicular thereto that is smaller in extent than said length, said memory film in a said bit structure being characterized by an anisotropy field, and said width being sufficiently small that demagnetization fields arising in said memory film in response to its saturation magnetization being oriented along that said width exceed in magnitude said anisotropy field.

11. The apparatus of claim 9 wherein a said bit structure has a length along a selected direction and a width substantially perpendicular thereto that is smaller in extent than said length and has a shaped end portion extending over a portion of said length in which said width gradually reduces to zero at an end thereof.

12. The apparatus of claim 9 wherein said memory film at each of said major surfaces of said intermediate layer of at least one of said bit structures is arranged such that there are two separate films with one of said separate films on each of said major surfaces, and said intermediate layer is of an electrical insulating kind of material.

13. The apparatus of claim 12 wherein said bit structure has a length along selected direction and a width substantially perpendicular thereto that is smaller in extent than said length, said width being less than about two curling lengths of said separate films from edges thereof substantially perpendicular to said width.

14. The apparatus of claim 12 wherein said memory film at each of said major surfaces is a composite film having a thinner stratum of higher magnetic saturation induction adjacent said intermediate material and a thicker stratum of lower magnetic saturation induction.

* * * * *

UNITED STATES PATENT AND TRADEMARK OFFICE
CERTIFICATE OF CORRECTION

PATENT NO. : 6,021,065

DATED : FEBRUARY 1, 2000

INVENTOR(S) : JAMES M. DAUGHTON ET AL.

It is certified that error appears in the above-identified patent and that said Letters Patent is hereby corrected as shown below:

Col. 6, line 15, delete "dielectric", and insert therefor -- nonmagnetic --.

Col. 6, line 22, after "material", insert -- which can be a dielectric --.

Col. 7, line 27, delete "which are set by their magnetization", insert --, the latter being set by the layer magnetization --.

Col. 8, line 3, delete "this", and insert therefor -- This --.

Col. 8, line 18, delete "A portion of just layer 11 is shown in the high resolution drawing of Figure 2."

Col. 8, line 58, after "result", insert -- after subsequent structure forming steps --.

Col. 9, line 19, after "absence", insert -- leaving the entire layer formed as stratum 13 --.

Col. 9, line 54, after "passivate", insert -- and --.

Col. 9, line 61, delete "from" and insert therefor -- form --.

Col. 10, line 12, after "in", insert -- forming --.

Col. 10, line 53, after "therethrough", and before the comma, insert -- in a following etching --.

UNITED STATES PATENT AND TRADEMARK OFFICE
CERTIFICATE OF CORRECTION

PATENT NO. : 6,021,065
DATED : FEBRUARY 1, 2000
INVENTOR(S) : JAMES M. DAUGHTON ET AL.

It is certified that error appears in the above-identified patent and that said Letters Patent is hereby corrected as shown below:

Col. 10, line 54, after "of" insert -- other --.

Col. 10, line 63, after "of" insert -- the --.

Col. 11, line 10, after "therethrough" and before the comma, insert -- in a further etching step --

Col. 22, line 5, delete:

$$E = \left(1 - \frac{W^2}{L^2}\right)^{\frac{1}{2}}.$$

and insert therefor the following:

$$e = \left(1 - \frac{W^2}{L^2}\right)^{\frac{1}{2}}.$$

Col. 24, line 15, delete "$e^2$" and insert therefor --$1-e^2$--.

Col. 34, line 51, after "directly" and before the period, insert --as in Figures 8A, 9A and 10A--

Col. 37, line 5, delete [such];

Col. 37, Claim 6, line 5, after "intermediate", insert -- layer --

Col. 37, Claim 8, line 4, after "intermediate" insert --layer--.

UNITED STATES PATENT AND TRADEMARK OFFICE
CERTIFICATE OF CORRECTION

PATENT NO. : 6,021,065
DATED : FEBRUARY 1, 2000
INVENTOR(S) : JAMES M. DAUGHTON ET AL.

It is certified that error appears in the above-identified patent and that said Letters Patent is hereby corrected as shown below:

Col. 38, Claim 9, line 15, delete [means], insert -- devices --

Col. 40, Claim 14, line 4, delete [material], insert -- layer --

Please insert the following claims 62-80 as claims 15-33 as follows--

62. A ferromagnetic thin-film based digital memory circuit electrically connected to interconnection means suited for electrical connection to a source of electrical energization, said circuit comprising:

a pair of switching devices, each having first and second terminating regions and a control region by which that said switching device is capable of being directed to provide a conductive path between that said switching device first and second terminating regions of a selected conductivity;

a pair of load devices each capable of conducting current therethrough to result in a voltage drop thereacross and each electrically connected in series with said second terminating region of a corresponding one of said plurality of switching devices and said interconnection means, said pair of load devices each also being coupled to a control region of that one of said pair of switching devices opposite that with which it is electrically connected in series; and

UNITED STATES PATENT AND TRADEMARK OFFICE
CERTIFICATE OF CORRECTION

PATENT NO. : 6,021,065
DATED : FEBRUARY 1, 2000
INVENTOR(S) : JAMES M. DAUGHTON ET AL.

It is certified that error appears in the above-identified patent and that said Letters Patent is hereby corrected as shown below:

a pair of bit structures each coupled to a corresponding one of said pair of load devices so as to result in different value voltages at said control regions of said pair of switching devices during operation, said bit structures comprising:

a nonmagnetic intermediate layer, said intermediate layer having two major surfaces on opposite sides thereof; and a memory film of an anisotropic ferromagnetic material on each of said intermediate layer major surfaces having switching thresholds for magnetizations of said film adjacent each of said intermediate layer major surfaces that differ in value for a switching of these magnetizations from both being directed initially at least in part in substantially a common direction to being directed at least in part in substantially opposite directions versus a switching from being directed initially at least in part in substantially opposite directions to both being directed at least in part in substantially a common direction, and

UNITED STATES PATENT AND TRADEMARK OFFICE
CERTIFICATE OF CORRECTION

PATENT NO. : 6,021,065            Page 5 of 13
DATED : FEBRUARY 1, 2000
INVENTOR(S) : JAMES M. DAUGHTON ET AL.

It is certified that error appears in the above-identified patent and that said Letters Patent is hereby corrected as shown below:

>a word line structure having a pair of word line end terminal regions adapted to conduct electrical current in at least one direction therethrough, said pair of word line end terminal regions having an electrical conductor electrically connected therebetween which is located across an electrical insulating layer from said memory film on one of said major surfaces of said intermediate layer of a corresponding one of said bit structures.

63. The apparatus of claim 62 wherein said pair of bit structures each is electrically connected between one of said pair of load devices and a said control region of one of said switching devices.

64. The apparatus of claim 62 wherein said pair of bit structures each is electrically connected between one of said pair of load devices and a said second terminating region of one of said switching devices.

UNITED STATES PATENT AND TRADEMARK OFFICE
CERTIFICATE OF CORRECTION

PATENT NO. : 6,021,065
DATED : FEBRUARY 1, 2000
INVENTOR(S) : JAMES M. DAUGHTON ET AL.

It is certified that error appears in the above-identified patent and that said Letters Patent is hereby corrected as shown below:

65. The apparatus of claim 62 wherein a said bit structure has a length along a selected direction and a width substantially perpendicular thereto that is smaller in extent than said length, said memory film in a said bit structure being characterized by an anisotropy field, and said width being sufficiently small that demagnetization fields arising in said memory film in response to its saturation magnetization being oriented along that said width exceed in magnitude said anisotropy field.

66. The apparatus of claim 62 wherein a said bit structure has a length along a selected direction and a width substantially perpendicular thereto that is smaller in extent than said length and has a shaped end portion extending over a portion of said length in which said width gradually reduces to zero at an end thereof.

67. The apparatus of claim 62 wherein said memory film at each of said major surfaces of said intermediate layer of at least one of said bit structures is arranged such that there are two separate films with one of said separate films on each of said major surfaces.

UNITED STATES PATENT AND TRADEMARK OFFICE
CERTIFICATE OF CORRECTION

PATENT NO. : 6,021,065
DATED : FEBRUARY 1, 2000
INVENTOR(S) : JAMES M. DAUGHTON ET AL.

It is certified that error appears in the above-identified patent and that said Letters Patent is hereby corrected as shown below:

68. The apparatus of claim 67 wherein said bit structure has a length along selected direction and a width substantially perpendicular thereto that is smaller in extent than said length, said width being less than about two curling lengths of said separate films from edges thereof substantially perpendicular to said width.

69. The apparatus of claim 67 wherein said memory film at each of said major surfaces is a composite film having a thinner stratum of higher magnetic saturation induction adjacent said intermediate layer and a thicker stratum of lower magnetic saturation induction.

70. The apparatus of claim 67 wherein said intermediate layer is of an electrical insulating kind of material.

71. The apparatus of claim 67 further comprising another word line structure having a pair of word line end terminal regions adapted to conduct electrical current in at least one direction therethrough, said pair of word line end terminal regions having an electrical conductor electrically connected therebetween which is located across an electrical insulating layer from said memory film on one of said major surfaces of said intermediate layer of a corresponding one of said bit structures.

UNITED STATES PATENT AND TRADEMARK OFFICE
CERTIFICATE OF CORRECTION

PATENT NO. : 6,021,065
DATED : FEBRUARY 1, 2000
INVENTOR(S) : JAMES M. DAUGHTON ET AL.

It is certified that error appears in the above-identified patent and that said Letters Patent is hereby corrected as shown below:

72. A ferromagnetic thin-film based digital memory circuit electrically connected to interconnection means suited for electrical connection to a source of electrical energization, said circuit comprising:

a pair of switching devices, each having first and second terminating regions and a control region by which that said switching device is capable of being directed to provide a conductive path between that said switching device first and second terminating regions of a selected conductivity;

a pair of load devices each capable of conducting current therethrough to result in a voltage drop thereacross and each electrically connected in series with said second terminating region of a corresponding one of said plurality of switching devices and said interconnection means, said pair of load devices each also being coupled to a control region of that one of said pair of switching devices opposite that with which it is electrically connected in series; and

UNITED STATES PATENT AND TRADEMARK OFFICE
CERTIFICATE OF CORRECTION

PATENT NO. : 6,021,065
DATED : FEBRUARY 1, 2000
INVENTOR(S) : JAMES M. DAUGHTON ET AL.

It is certified that error appears in the above-identified patent and that said Letters Patent is hereby corrected as shown below:

> a pair of bit structures each electrically connected in series with said second terminating region of a corresponding one of said plurality of switching devices so as to result in different value voltages at said control regions of said pair of switching devices during operation, said bit structures comprising:
>
> a nonmagnetic intermediate layer, said intermediate layer having two major surfaces on opposite sides thereof; and
>
> a memory film of an anisotropic ferromagnetic material on each of said intermediate layer major surfaces having switching thresholds for magnetizations of said film adjacent each of said intermediate layer major surfaces that differ in value for a switching of these magnetizations from both being directed initially at least in part in substantially a common direction to being directed at least in part in substantially opposite directions versus a switching from being directed initially at least in part in substantially opposite directions to both being directed at least in part in substantially a common direction, and

UNITED STATES PATENT AND TRADEMARK OFFICE
CERTIFICATE OF CORRECTION

PATENT NO. : 6,021,065
DATED : FEBRUARY 1, 2000
INVENTOR(S) : JAMES M. DAUGHTON ET AL.

It is certified that error appears in the above-identified patent and that said Letters Patent is hereby corrected as shown below:

a word line structure having a pair of word line end terminal regions adapted to conduct electrical current in at least one direction therethrough, said pair of word line end terminal regions having an electrical conductor electrically connected therebetween which is located across an electrical insulating layer from said memory film on one of said major surfaces of said intermediate layer of a corresponding one of said bit structures.

73. The apparatus of claim 72 wherein a said bit structure has a length along a selected direction and a width substantially perpendicular thereto that is smaller in extent than said length, said memory film in a said bit structure being characterized by an anisotropy field, and said width being sufficiently small that demagnetization fields arising in said memory film in response to its saturation magnetization being oriented along that said width exceed in magnitude said anisotropy field.

74. The apparatus of claim 72 wherein a said bit structure has a length along a selected direction and a width substantially perpendicular thereto that is smaller in extent than said length and has a shaped end portion extending over a portion of said ~~length in which said width gradually reduces to zero at an end thereof.~~

UNITED STATES PATENT AND TRADEMARK OFFICE
CERTIFICATE OF CORRECTION

PATENT NO. : 6,021,065
DATED : FEBRUARY 1, 2000
INVENTOR(S) : JAMES M. DAUGHTON ET AL.

It is certified that error appears in the above-identified patent and that said Letters Patent is hereby corrected as shown below:

75. The apparatus of claim 72 wherein said memory film at each of said major surfaces of said intermediate layer of at least one of said bit structures is arranged such that there are two separate films with one of said separate films on each of said major surfaces.

76. The apparatus of claim 75 wherein said bit structure has a length along selected direction and a width substantially perpendicular thereto that is smaller in extent than said length, said width being less than about two curling lengths of said separate films from edges thereof substantially perpendicular to said width.

77. The apparatus of claim 75 wherein said memory film at each of said major surfaces is a composite film having a thinner stratum of higher magnetic saturation induction adjacent said intermediate layer and a thicker stratum of lower magnetic saturation induction.

UNITED STATES PATENT AND TRADEMARK OFFICE
CERTIFICATE OF CORRECTION

PATENT NO. : 6,021,065

DATED : FEBRUARY 1, 2000

INVENTOR(S) : JAMES M. DAUGHTON ET AL.

It is certified that error appears in the above-identified patent and that said Letters Patent is hereby corrected as shown below:

78. The apparatus of claim 75 wherein said intermediate layer is of an electrical insulating kind of material.

79. The apparatus of claim 75 further comprising another word line structure having a pair of word line end terminal regions adapted to conduct electrical current in at least one direction therethrough, said pair of word line end terminal regions having an electrical conductor electrically connected therebetween which is located across an electrical insulating layer from said memory film on one of said major surfaces of said intermediate layer of a corresponding one of said bit structures.

UNITED STATES PATENT AND TRADEMARK OFFICE
CERTIFICATE OF CORRECTION

PATENT NO. : 6,021,065

DATED : FEBRUARY 1, 2000

INVENTOR(S) : JAMES M. DAUGHTON ET AL.

It is certified that error appears in the above-identified patent and that said Letters Patent is hereby corrected as shown below:

80. The apparatus of claim 75 further comprising a selection switching device having first and second terminating regions and a control region by which said selection switching device is capable of being directed to provide a conductive path between that said selection switching device first and second terminating regions of a selected conductivity, said switching device first terminating region electrically connected in series with one of said pair of bit structures and said second terminating region of a corresponding one of said plurality of switching devices.

Signed and Sealed this

Twenty-third Day of January, 2001

*Attest:*

Q. TODD DICKINSON

*Attesting Officer*    *Commissioner of Patents and Trademarks*